(12) United States Patent
Koezuka et al.

(10) Patent No.: US 8,859,330 B2
(45) Date of Patent: Oct. 14, 2014

(54) METHOD FOR MANUFACTURING SEMICONDUCTOR DEVICE

(75) Inventors: Junichi Koezuka, Tochigi (JP); Shinji Ohno, Atsugi (JP); Yuichi Sato, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/419,468

(22) Filed: Mar. 14, 2012

(65) Prior Publication Data

US 2012/0244658 A1 Sep. 27, 2012

(30) Foreign Application Priority Data

Mar. 23, 2011 (JP) ................................. 2011-063976

(51) Int. Cl.
*H01L 21/00* (2006.01)
*H01L 21/425* (2006.01)
*H01L 29/66* (2006.01)
*H01L 29/786* (2006.01)
*H01L 27/12* (2006.01)

(52) U.S. Cl.
CPC ........ *H01L 21/425* (2013.01); *H01L 29/66742* (2013.01); *H01L 29/7869* (2013.01); *H01L 27/1225* (2013.01)
USPC .................... 438/104; 438/149; 257/E29.296

(58) Field of Classification Search
USPC ................... 438/510–541, 608, 609
See application file for complete search history.

(56) References Cited

U.S. PATENT DOCUMENTS

| 5,496,752 | A | * | 3/1996 | Nasu et al. ...................... 438/30 |
| 5,731,856 | A | | 3/1998 | Kim et al. |
| 5,744,864 | A | | 4/1998 | Cillessen et al. |
| 5,955,785 | A | * | 9/1999 | Gardner et al. ............... 257/751 |
| 6,294,274 | B1 | | 9/2001 | Kawazoe et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Charles Garber
*Assistant Examiner* — Evren Seven
(74) *Attorney, Agent, or Firm* — Eric J. Robinson; Robinson Intellectual Property Law Office, P.C.

(57) ABSTRACT

A semiconductor device including an oxide semiconductor, which has stable electric characteristics and high reliability, is provided. In a method for manufacturing a transistor including an oxide semiconductor film, an implantation step where rare gas ions are implanted to the oxide semiconductor film is performed, and the oxide semiconductor film to which rare gas ions are implanted is subjected to a heating step under reduced pressure, in a nitrogen atmosphere, or in a rare gas atmosphere, whereby hydrogen or water contained in the oxide semiconductor film to which rare gas ions are implanted is released; thus, the oxide semiconductor film is highly purified.

26 Claims, 13 Drawing Sheets

(56) References Cited

U.S. PATENT DOCUMENTS

| | | | |
|---|---|---|---|
| 6,563,174 B2 | 5/2003 | Kawasaki et al. | |
| 6,677,221 B2 * | 1/2004 | Kawasaki et al. | 438/486 |
| 6,727,522 B1 | 4/2004 | Kawasaki et al. | |
| 6,808,970 B2 * | 10/2004 | Feudel et al. | 438/174 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 7,956,359 B2 * | 6/2011 | Yamazaki | 257/59 |
| 8,129,719 B2 * | 3/2012 | Yamazaki et al. | 257/43 |
| 8,237,166 B2 | 8/2012 | Kumomi et al. | |
| 8,258,515 B2 * | 9/2012 | Yamazaki | 257/59 |
| 8,368,076 B2 * | 2/2013 | Yamazaki | 257/59 |
| 8,389,417 B2 * | 3/2013 | Yamazaki et al. | 438/722 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0037309 A1 * | 2/2007 | Nakamura et al. | 438/48 |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0142803 A1 * | 6/2008 | Kaitoh et al. | 257/59 |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 * | 12/2008 | Ryu et al. | 257/43 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0142887 A1 * | 6/2009 | Son et al. | 438/151 |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2013/0020569 A1 * | 1/2013 | Yamazaki et al. | 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2010-003822 | 1/2010 |
| WO | WO-2004/114391 | 12/2004 |

OTHER PUBLICATIONS

Dembo.H et al., "RFCPUS on Glass and Plastic Substrates Fabricated by TFT Transfer Technology.", IEDM 05 : Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Dispaly Workshops, Dec. 3, 2008, pp. 1637-1640.

Hayashi.R et al., "42.1: Invited Paper: Improved Amorphous In—Ga—Zn—O TFTs,", SID Digest '08 : SID International Sym-

(56) References Cited

OTHER PUBLICATIONS posium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jul. 17, 1996, vol. 68, No. 25, pp. 3650-3652.
Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical Properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controleld Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandel OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09 : Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:the "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Odixe TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display

(56) References Cited

OTHER PUBLICATIONS

Application,", SID Digest '07 : SID International Symposim Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3-BO Systems [A; Fe, Ga, or Al: B: Mg, Mn, Fe, Ni, Cu,or Zn] at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Fiml Transistors,", JPN. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of The Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

METHOD FOR MANUFACTURING SEMICONDUCTOR DEVICE

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electro-optic device, a semiconductor circuit, and an electronic device are all semiconductor devices.

2. Description of the Related Art

Attention has been directed to a technique for forming a transistor (also referred to as a thin film transistor (TFT)) using a semiconductor thin film formed over a substrate having an insulating surface. Such a transistor is applied to a wide range of electronic devices such as an integrated circuit (IC) and an image display device (display device). As a semiconductor thin film applicable to the transistor, a silicon based semiconductor material is widely known. Moreover, an oxide semiconductor has been attracting attention as another material.

For example, a transistor whose active layer includes an amorphous oxide containing indium (In), gallium (Ga), and zinc (Zn) and having an electron carrier concentration of less than $10^{18}/cm^3$ is disclosed (see Patent Document 1).

REFERENCE

Patent Document

[Patent Document 1] Japanese Published Patent Application No. 2006-165528

SUMMARY OF THE INVENTION

However, the electric conductivity of an oxide semiconductor changes when, for example, hydrogen or moisture forming an electron donor enters the oxide semiconductor during a thin film formation process. Such a phenomenon causes variation in the electric characteristics of a transistor including the oxide semiconductor.

In view of the above problem, it is an object to provide a semiconductor device including an oxide semiconductor, which has stable electric characteristics and high reliability.

In a method for manufacturing a transistor including an oxide semiconductor film, rare gas ions (rare gas elements) are implanted to the oxide semiconductor film and the oxide semiconductor film to which rare gas ions are implanted is subjected to a heating step. Through the rare gas ion implantation step and the heating step, an impurity examples of which are hydrogen and an impurity containing hydrogen (a hydroxyl group or hydride (also referred to as a hydrogen compound)) such as water is intentionally removed from the oxide semiconductor film, whereby the oxide semiconductor film is highly purified.

Note that in this specification, treatment for removing hydrogen or an impurity containing hydrogen such as water from an oxide semiconductor film by a heating step is also referred to as dehydration or dehydrogenation treatment.

In a heating step where dehydration or dehydrogenation treatment is performed, it is preferable that a surface of an oxide semiconductor film be not in a state where hydrogen, water, or the like is prevented from being released (for example, by providing a film or the like which is not permeable to (or blocks) hydrogen, water, or the like), but in a state where the surface of the oxide semiconductor film is exposed.

By an implantation of rare gas ions to an oxide semiconductor film, a bond between hydrogen and an element (e.g., a metal element) included in an oxide semiconductor is cut. Thus, hydrogen which is an impurity can be easily detached from the oxide semiconductor film by a heating step which is performed after the implantation of rare gas ions. Further, since a void (defect) is formed in the film by the implantation of rare gas ions, hydrogen after the bond is cut can be easily detached from the film via the void.

Further, a bond between a hydroxyl group and an element (e.g., a metal element) included in the oxide semiconductor is also cut by the implantation of rare gas ions to the oxide semiconductor film. Thus, in some cases, hydrogen is detached from the oxide semiconductor film as water as a result of bonding between hydrogen after the bond is cut and a hydroxyl group after the bond is cut.

An oxide semiconductor film is highly purified by removing hydrogen, which is an n-type impurity, from the oxide semiconductor film so that impurities are contained as few as possible, and then oxygen is sufficiently supplied to the oxide semiconductor film; thus, an i-type (intrinsic) or substantially i-type (intrinsic) oxide semiconductor film can be obtained. In other words, oxygen is sufficiency supplied to an oxide semiconductor film from which impurities such as hydrogen and water are removed as much as possible, whereby a highly purified i-type (intrinsic) oxide semiconductor or an oxide semiconductor close thereto can be obtained. This enables the Fermi level ($E_f$) of the oxide semiconductor to be at the same level as the intrinsic Fermi level ($E_i$).

In order to effectively obtain a highly purified oxide semiconductor film by dehydration or dehydrogenation treatment, in a rare gas ion implantation step, a peak of the concentration of an implanted rare gas element in the oxide semiconductor film is set greater than or equal to $1\times10^{19}$ atoms/cm$^3$ and less than or equal to $3\times10^{22}$ atoms/cm$^3$ (preferably greater than or equal to $1\times10^{20}$ atoms/cm$^3$ and less than or equal to $3\times10^{21}$ atoms/cm$^3$). By implantation of rare gas ions to the oxide semiconductor film (and interface surfaces thereof), which is performed so that the above concentration range is satisfied, a bond between an element included in an oxide semiconductor and hydrogen can be sufficiently cut and a void (defect) in the film can be sufficiently formed; thus, hydrogen can be detached effectively from the oxide semiconductor film.

When the peak of the concentration of a rare gas element in the oxide semiconductor film is lower than the above range, bond breaking between an element included in an oxide semiconductor and hydrogen and formation of a void (defect) in the film by implanting rare gas ions are not performed sufficiently; thus, an effect of dehydration or dehydrogenation treatment for the oxide semiconductor film cannot be sufficiently obtained.

On the other hand, when the peak of the concentration of a rare gas element in the oxide semiconductor film is higher than the above range, an implantation of an excessive amount of rare gas ions might cause an adverse effect on the oxide semiconductor film, such as deterioration in film quality including a defect in shape or a weakened film, variation in the electric characteristics, or the like.

Accordingly, when the concentration is lower or higher than the above range, it is difficult to obtain an oxide semiconductor film which is sufficiently highly purified so that a transistor having stable electric characteristics is manufactured.

In a method for manufacturing a semiconductor device, according to one embodiment of the invention disclosed in this specification, an oxide semiconductor film is formed; an implantation step where rare gas ions are implanted at least to the oxide semiconductor film is performed; and the oxide semiconductor film to which rare gas ions are implanted is subjected to a heating step under reduced pressure, in a nitrogen atmosphere, or in a rare gas atmosphere, so that hydrogen or water contained in the oxide semiconductor film to which rare gas ions are implanted is released. In the implantation step, a peak of the concentration of an implanted rare gas element in the oxide semiconductor film is greater than or equal to $1 \times 10^{19}$ atoms/cm$^3$ and less than or equal to $3 \times 10^{22}$ atoms/cm$^3$.

In a method for manufacturing a semiconductor device, according to one embodiment of the invention disclosed in this specification, an oxide semiconductor film is formed; an implantation step where rare gas ions are implanted at least to the oxide semiconductor film is performed; the oxide semiconductor film to which rare gas ions are implanted is subjected to a heating step under reduced pressure, in a nitrogen atmosphere, or in a rare gas atmosphere, so that hydrogen or water contained in the oxide semiconductor film to which rare gas ions are implanted is released; and an insulating layer in contact with at least part of the oxide semiconductor film which is subjected to the heating step is formed. In the implantation step, a peak of the concentration of an implanted rare gas element in the oxide semiconductor film is greater than or equal to $1 \times 10^{19}$ atoms/cm$^3$ and less than or equal to $3 \times 10^{22}$ atoms/cm$^3$.

In a method for manufacturing a semiconductor device, according to one embodiment of the invention disclosed in this specification, an oxide semiconductor film is formed; an implantation step where rare gas ions are implanted at least to the oxide semiconductor film is performed; and the oxide semiconductor film to which rare gas ions are implanted is subjected to a heating step under reduced pressure, in a nitrogen atmosphere, or in a rare gas atmosphere, so that hydrogen or water contained in the oxide semiconductor film to which rare gas ions are implanted is released. In the implantation step, a peak of the concentration of an implanted rare gas element in the oxide semiconductor film is greater than or equal to $1 \times 10^{19}$ atoms/cm$^3$ and less than or equal to $3 \times 10^{22}$ atoms/cm$^3$. The heating step is performed with a surface of the oxide semiconductor film exposed.

In a method for manufacturing a semiconductor device, according to one embodiment of the invention disclosed in this specification, an oxide semiconductor film is formed; an implantation step where rare gas ions are implanted at least to the oxide semiconductor film is performed; the oxide semiconductor film to which rare gas ions are implanted is subjected to a heating step under reduced pressure, in a nitrogen atmosphere, or in a rare gas atmosphere, so that hydrogen or water contained in the oxide semiconductor film to which rare gas ions are implanted is released; and an insulating layer in contact with at least part of the oxide semiconductor film which is subjected to the heating step is formed. In the implantation step, a peak of the concentration of an implanted rare gas element in the oxide semiconductor film is greater than or equal to $1 \times 10^{19}$ atoms/cm$^3$ and less than or equal to $3 \times 10^{22}$ atoms/cm$^3$. The heating step is performed with a surface of the oxide semiconductor film exposed.

The oxide semiconductor film which is subjected to the heating step may be amorphous or may include a crystal portion. The oxide semiconductor film to which rare gas ions are implanted may be used as a channel formation region of a transistor.

As an element (ion) used in the implantation step, one or more kinds of rare gas elements (preferably argon, krypton, xenon, or the like) may be used. In the case of using a plurality of kinds of rare gas elements, the concentration of implanted rare gas elements in an oxide semiconductor film is the total concentration of the plurality of kinds of rare gas elements. As a method for implanting rare gas ions, an ion implantation method, an ion doping method, a plasma immersion ion implantation method, or the like may be used.

The heating step may be performed on the oxide semiconductor film, to which rare gas ions are implanted, at a temperature higher than or equal to 300° C. and lower than or equal to 700° C. or lower than the strain point of a substrate. The heating step may be performed under reduced pressure, in a nitrogen atmosphere, or in a rare gas atmosphere.

In the steps (the rare gas ion implantation step and the heating step) for removing an impurity such as hydrogen or water, oxygen which is a main component of the oxide semiconductor might also be detached and reduced. There is an oxygen defect in a portion where oxygen is detached in the oxide semiconductor film and a donor level which leads to variation in the electric characteristics of a transistor is formed owing to the oxygen defect.

Thus, oxygen is preferably supplied to the oxide semiconductor film which is subjected to the rare gas ion implantation step and the heating step for dehydration or dehydrogenation treatment. By supply of oxygen to the oxide semiconductor film, oxygen defects in the film can be filled.

For example, when an oxide insulating layer containing much (excessive) oxygen, which serves as an oxygen supply source, is provided so as to be in contact with the oxide semiconductor film, oxygen can be supplied from the oxide insulating layer to the oxide semiconductor film. In the above structure, the oxide semiconductor film which is subjected to the heating step and the oxide insulating layer may be subjected to a heating step in a state where the oxide insulating layer is in contact with at least part of the oxide semiconductor film so that oxygen is supplied to the oxide semiconductor film.

Oxygen (which includes at least one of an oxygen radical, an oxygen atom, and an oxygen ion) may be introduced into the oxide semiconductor film so that oxygen is supplied to the film which is subjected to the rare gas ion implantation step and the heating step for dehydration or dehydrogenation treatment. As a method for introducing oxygen, an ion implantation method, an ion doping method, a plasma immersion ion implantation method, plasma treatment, or the like may be used.

Further, it is preferable that the oxide semiconductor film in a transistor include a region where the oxygen content is higher than that in the stoichiometric composition of the oxide semiconductor in a crystalline state. In that case, the oxygen content is higher than that in the stoichiometric composition of the oxide semiconductor or higher than that in the stoichiometric composition of the oxide semiconductor in a single crystal state. In some cases, oxygen exists between lattices of the oxide semiconductor.

Note that it is preferable that the oxide semiconductor film be formed under a condition that much oxygen is contained during film formation, so that a film containing much oxygen (preferably including a region where the oxygen content is higher than that in the stoichiometric composition of the oxide semiconductor in a crystalline state) is formed.

As described above, variation in electric characteristics of a transistor including an electrically i-type (intrinsic) oxide semiconductor film obtained by sufficiently supplying oxygen to a highly purified oxide semiconductor film is suppressed and the transistor is electrically stable. Accordingly, a highly reliable semiconductor device including an oxide semiconductor, which has stable electric characteristics, can be provided.

In a method for manufacturing a transistor including an oxide semiconductor film, rare gas ions (rare gas elements) are implanted to the oxide semiconductor film and the oxide semiconductor film to which rare gas ions are implanted is subjected to a heating step. Through the rare gas ion implantation step and the heating step, an impurity examples of which are hydrogen and an impurity containing hydrogen (a hydroxyl group or hydride (also referred to as a hydrogen compound)) such as water is intentionally removed from the oxide semiconductor film, whereby the oxide semiconductor film can be highly purified. Variation in the electric characteristics of the transistor including an electrically i-type (intrinsic) oxide semiconductor film obtained by sufficiently supplying oxygen to the highly purified oxide semiconductor film is suppressed and the transistor is electrically stable.

Therefore, according to one embodiment of the present invention, a transistor having stable electric characteristics can be manufactured.

In addition, according to one embodiment of the present invention, a semiconductor device including a transistor which has favorable electric characteristics and high reliability can be manufactured.

DETAILED DESCRIPTION OF THE INVENTION

Hereinafter, embodiments and an example of the present invention disclosed in this specification will be described in detail with reference to the accompanying drawings. However, the present invention disclosed in this specification is not limited to the description below, and it is easily understood by those skilled in the art that modes and details disclosed herein can be modified in various ways. Therefore, the present invention disclosed in this specification is not construed as being limited to the description of the embodiments and the example below. Note that the ordinal numbers such as "first" and "second" in this specification are used for convenience and do not denote the order of steps and the stacking order of layers. In addition, the ordinal numbers in this specification do not denote particular names which specify the invention.

(Embodiment 1)

In this embodiment, one embodiment of a semiconductor device and a method for manufacturing the semiconductor device will be described with reference to FIGS. 1A to 1F. In this embodiment, a transistor including an oxide semiconductor film will be described as an example of the semiconductor device.

Figure 1A:
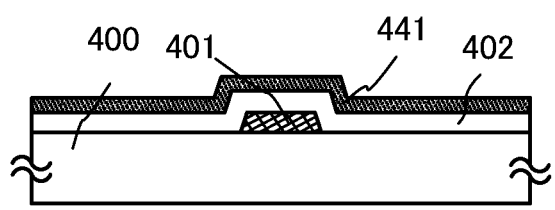
FIGS. 1A to 1F are diagrams illustrating one embodiment of a semiconductor device and a method for manufacturing the semiconductor device.
Figure 1B:
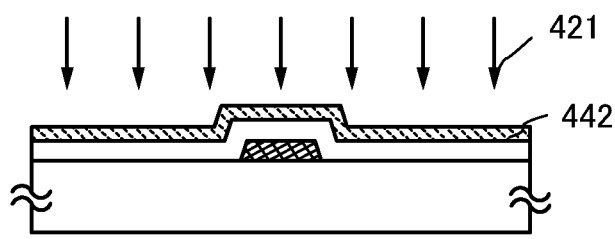
Figure 1C:
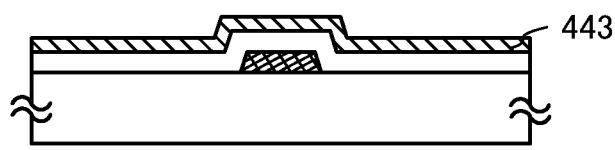
Figure 1D:
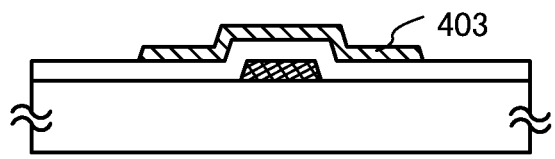
Figure 1E:
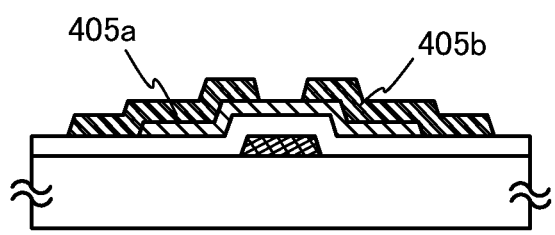
Figure 1F:
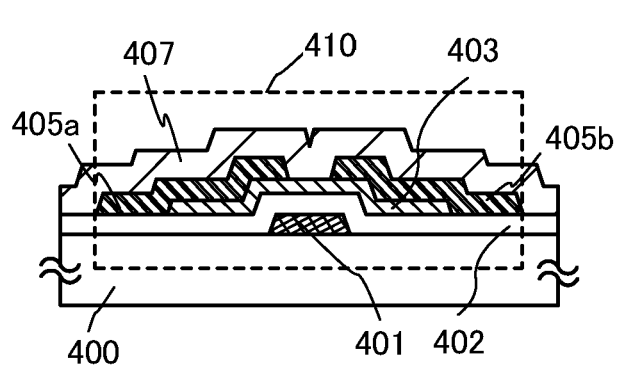

As illustrated in FIG. 1F, a transistor 410 includes, over a substrate 400 having an insulating surface, a gate electrode layer 401, a gate insulating layer 402, an oxide semiconductor film 403, a source electrode layer 405a, and a drain electrode layer 405b. An insulating layer 407 is stacked over the transistor 410.

FIGS. 1A to 1F illustrate an example of a method for manufacturing the transistor 410.

First, a conductive film is formed over the substrate 400 having an insulating surface, and then, the gate electrode layer 401 is formed by a first photolithography process. Note that a resist mask may be formed by an inkjet method. Formation of the resist mask by an inkjet method needs no photomask; thus, manufacturing cost can be reduced.

Although there is no particular limitation on a substrate which can be used as the substrate 400 having an insulating surface, it is necessary that the substrate at least have enough heat resistance to a heat treatment to be performed later. For example, a glass substrate of barium borosilicate glass, aluminoborosilicate glass, or the like; a ceramic substrate; a quartz substrate; a sapphire substrate; or the like can be used. A single crystal semiconductor substrate or a polycrystalline semiconductor substrate of silicon, silicon carbide, or the like; a compound semiconductor substrate of silicon germanium or the like; an SOI substrate; or the like can also be used as the substrate 400. Alternatively, any of these substrate over which a semiconductor element is provided may be used as the substrate 400.

The semiconductor device may be manufactured using a flexible substrate as the substrate 400. In order to manufacture a flexible semiconductor device, the transistor 410 including the oxide semiconductor film 403 may be directly formed over a flexible substrate. Alternatively, the transistor 410 including the oxide semiconductor film 403 may be formed over a manufacturing substrate, and then, the transistor 410 may be separated from the manufacturing substrate and transferred to a flexible substrate. Note that in order to separate the transistor from the manufacturing substrate and transfer it to the flexible substrate, a separation layer may be provided between the manufacturing substrate and the transistor 410 including the oxide semiconductor film 403.

An insulating film serving as a base film may be provided between the substrate 400 and the gate electrode layer 401. The base film has a function of preventing diffusion of impurity elements from the substrate 400, and can be formed to have a single-layer structure or a stacked-layer structure using one or more of a silicon nitride film, a silicon oxide film, a silicon nitride oxide film, and a silicon oxynitride film.

The gate electrode layer 401 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 401. The gate electrode layer 401 may have a single-layer structure or a stacked-layer structure.

The gate electrode layer 401 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a nitride of such a light-transmitting conductive material. It is also possible that the gate electrode layer 401 has a stacked-layer structure of the above light-transmitting conductive material and the above metal material.

The gate electrode layer 401 may have a stacked-layer structure one layer of which is formed using an In—Sn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, or a Zn—O-based metal oxide. It is preferable that the gate electrode layer 401 have a stacked-layer structure one layer of which is formed using an oxynitride film containing indium, gallium, and zinc which are materials having particularly high work functions (also referred to as an IGZON film). The oxynitride film containing indium, gallium, and zinc is formed in a mixed gas atmosphere containing argon and nitrogen.

For example, the gate electrode layer 401 can have a stacked-layer structure in which a copper film; a tungsten film; and an oxynitride film containing indium, gallium, and zinc (IGZON film) are stacked in this order from the substrate 400 side or a stacked-layer structure in which a tungsten film, a tungsten nitride film, a copper film, and a titanium film are stacked in this order from the substrate 400 side.

Next, the gate insulating layer 402 is formed over the gate electrode layer 401. The gate insulating layer 402 can be formed to have a single-layer structure or a stacked-layer structure using one or more of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, and a gallium oxide layer by a plasma CVD method, a sputtering method, or the like.

The oxide semiconductor in this embodiment is an intrinsic (i-type) or substantially intrinsic (i-type) oxide semiconductor which is obtained as follows: an oxide semiconductor is highly purified by removing an impurity so that impurities that serve as carrier donors and are substances which are not main components of the oxide semiconductor are contained as few as possible, and then oxygen is sufficiently supplied to the oxide semiconductor.

Such a highly purified oxide semiconductor is highly sensitive to an interface state or interface charge; thus, an interface between the oxide semiconductor film and the gate insulating layer is important. Accordingly, the gate insulating layer that is to be in contact with the highly purified oxide semiconductor needs to have high quality.

For example, high-density plasma CVD using microwaves (e.g., with a frequency of 2.45 GHz) is preferably employed because a dense insulating layer having high withstand voltage and high quality can be formed. When the highly purified oxide semiconductor and the high-quality gate insulating layer are in close contact with each other, the interface state density can be decreased and favorable interface characteristics can be obtained.

Needless to say, a different film formation method such as a sputtering method or a plasma CVD method can be employed as long as a high-quality insulating layer as the gate insulating layer can be formed. In addition, an insulating layer can be used, whose film quality as the gate insulating layer and characteristics of an interface with the oxide semiconductor are modified by heat treatment performed after film formation. In any case, any insulating layer can be used as long as film quality as the gate insulating layer is favorable, interface state density with the oxide semiconductor is decreased, and a favorable interface can be formed.

Further, when the gate insulating layer 402 that is to be in contact with the oxide semiconductor film 403 contains much oxygen, the gate insulating layer 402 can favorably function as a supply source which supplies oxygen to the oxide semiconductor film 403.

Next, an oxide semiconductor film 441 having a thickness of greater than or equal to 2 nm and less than or equal to 200 nm, preferably greater than or equal to 5 nm and less than or equal to 30 nm is formed over the gate insulating layer 402 (see FIG. 1A).

At that time, in order that hydrogen and water are contained as little as possible in the gate insulating layer 402 and the oxide semiconductor film 441, it is preferable that the substrate 400 over which the gate electrode layer 401 is formed or the substrate 400 over which films up to the gate insulating layer 402 are formed be preheated in a preheating chamber of a sputtering apparatus as pretreatment for the formation of the oxide semiconductor film 441, so that an impurity such as hydrogen or moisture adsorbed onto the substrate 400 are detached and removed. As an evacuation unit provided in the preheating chamber, a cryopump is preferable. Note that this preheating treatment can be omitted. In addition, this preheating treatment may be similarly performed on the substrate 400 over which films up to the source electrode layer 405*a* and the drain electrode layer 405*b* are formed, before forming the insulating layer 407.

Further, before the oxide semiconductor film 441 is formed by a sputtering method, powder substances (also referred to as particles or dusts), water, and organic compounds which are attached on a surface of the gate insulating layer 402 are preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to generate plasma in the vicinity of the substrate and modify a surface. Note that instead of an argon atmosphere, a nitrogen atmosphere, a helium atmosphere, an oxygen atmosphere, or the like may be used.

As an oxide semiconductor used for the oxide semiconductor film 441, any of the following oxide semiconductors can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; an In—O-based oxide semiconductor, a Sn—O-based oxide semiconductor, or a Zn—O-based oxide semiconductor; and the like. Further, $SiO_2$ may be contained in the above oxide semiconductor. Note that here, for example, an In—Ga—Zn—O-based oxide semiconductor means an oxide film containing indium (In), gallium (Ga), and zinc (Zn) and there is no particular limitation on the stoichiometric composition ratio. The In—Ga—Zn—O-based oxide semiconductor may contain an element other than In, Ga, and Zn.

In addition, for the oxide semiconductor film, a thin film of a material represented by the chemical formula, $InMO_3(ZnO)_m$ (m>0), can be used. Here, M represents one or more metal elements selected from Ga, Al, Mn, and Co. For example, M can be Ga, Ga and Al, Ga and Mn, Ga and Co, or the like.

In the case where an In—Zn—O-based material is used as the oxide semiconductor, the atomic ratio is In/Zn=0.5 to 50, preferably In/Zn=1 to 20, further preferably In/Zn=1.5 to 15. When the atomic ratio of Zn is in the above preferred range, the field-effect mobility of the transistor can be improved. Here, when the atomic ratio of the compound is In:Zn:O=X:Y:Z, the relation Z>1.5X+Y is satisfied.

In this embodiment, the oxide semiconductor film 441 is formed by a sputtering method with the use of an In—Ga—Zn—O-based metal oxide target. In addition, the oxide semiconductor film can be formed by a sputtering method in a rare gas (typically, argon) atmosphere, an oxygen atmosphere, or a mixed atmosphere containing a rare gas and oxygen.

As a target for forming the oxide semiconductor film by a sputtering method, for example, a metal oxide target having a composition ratio of $In_2O_3:Ga_2O_3:ZnO=1:1:1$ [molar ratio] is used to form an In—Ga—Zn—O film. Without limitation to the material and the component of the target, for example, a metal oxide target having a composition ratio of $In_2O_3:Ga_2O_3:ZnO=1:1:2$ [molar ratio] may be used.

Further, the filling rate of the metal oxide target is greater than or equal to 90% and less than or equal to 100%, preferably greater than or equal to 95% and less than or equal to 99.9%. With the use of a metal oxide target with a high filling rate, a dense oxide semiconductor film can be formed.

It is preferable that a high-purity gas from which an impurity such as hydrogen, water, a hydroxyl group, or hydride is removed be used as a sputtering gas for the formation of the oxide semiconductor film.

The substrate 400 is set in a deposition chamber kept under reduced pressure, and the substrate temperature is set to a temperature higher than or equal to 100° C. and lower than or equal to 600° C., preferably higher than or equal to 200° C. and lower than or equal to 400° C. When film formation is performed while the substrate 400 is heated, the concentration of impurities contained in the oxide semiconductor film 441 can be reduced. In addition, damage by sputtering can be reduced. Then, moisture remaining in the deposition chamber is removed; a sputtering gas from which an impurity such as hydrogen, water, a hydroxyl group, or hydride is removed is introduced; and the above-described target is used, so that the oxide semiconductor film 441 is formed over the substrate 400. In order to remove moisture remaining in the deposition chamber, an entrapment vacuum pump such as a cryopump, an ion pump, or a titanium sublimation pump is preferably used. As an evacuation unit, a turbo molecular pump provided with a cold trap may be used. In the deposition chamber which is evacuated with a cryopump, for example, hydrogen; a compound containing hydrogen, such as water (more preferably, a compound containing a carbon atom); and the like are removed, whereby the concentration of impurities in the oxide semiconductor film 441 formed in the deposition chamber can be reduced.

As one example of the film formation conditions is as follows: the distance between the substrate and the target is 60 mm, the pressure is 0.4 Pa, the electric power of a direct-current (DC) power source is 0.5 kW, and the atmosphere is an atmosphere containing argon and oxygen (the flow ratio of argon to oxygen is 30 sccm: 15 sccm). Note that a pulse direct-current power source is preferably used, in which case powder substances (also referred to as particles or dusts) that are generated in film formation can be reduced and the film thickness can be uniform.

As the oxide semiconductor film 441, a CAAC-OS (c-axis aligned crystalline oxide semiconductor) film which is an oxide semiconductor film including crystallized portions may be used.

CAAC-OS is an oxide semiconductor including a crystal with c-axis alignment which has a triangular or hexagonal atomic arrangement when seen from the direction of an a-b plane, a surface, or an interface and in which metal atoms are arranged in a layered manner, or metal atoms and oxygen atoms are arranged in a layered manner along a c-axis, and the direction of the a-axis or the b-axis is varied in the a-b plane (or the surface or the interface), that is, which rotates around the c-axis.

In a broad sense, CAAC-OS means a non-single-crystal material including a phase which has a triangular, hexagonal, regular triangular, or regular hexagonal atomic arrangement when seen from the direction perpendicular to the a-b plane and in which metal atoms are arranged in a layered manner, or metal atoms and oxygen atoms are arranged in a layered manner when seen from the direction perpendicular to the c-axis.

CAAC-OS is not a single crystal, but this does not mean that CAAC-OS is composed of only an amorphous component. Although CAAC-OS includes a crystallized portion (crystalline portion), a boundary between one crystalline portion and another crystalline portion is not clear in some cases.

Nitrogen may be substituted for part of oxygen included in CAAC-OS. The c-axes of individual crystalline portions included in CAAC-OS may be aligned in one direction (e.g., a direction perpendicular to a surface of a substrate over which CAAC-OS is formed, a surface of a CAAC-OS, a surface of a CAAC-OS film, an interface of a CAAC-OS, or the like). Alternatively, the normals of the a-b planes of the individual crystalline portions included in the CAAC-OS may be aligned in one direction (e.g., a direction perpendicular to a surface of a substrate over which CAAC-OS is formed, a surface of a CAAC-OS, a surface of a CAAC-OS film, an interface of a CAAC-OS, or the like).

In order to obtain CAAC-OS for the oxide semiconductor film 441, the oxide semiconductor film 441 may be formed while the substrate 400 is heated. The heating temperature of the substrate 400 may be higher than or equal to 150° C. and lower than or equal to 450° C., and the substrate temperature is preferably higher than or equal to 200° C. and lower than or equal to 350° C. Note that the heating temperature of the substrate at the time of the formation of the oxide semiconductor film 441 is high, whereby CAAC-OS in which the ratio of a crystal portion to an amorphous portion is high can be provided.

With use of the CAAC-OS film, it is possible to provide a highly reliable semiconductor device in which change in electric characteristics of a transistor due to irradiation with visible light or ultraviolet light can be reduced.

Note that it is preferable that the oxide semiconductor film 441 be formed under a condition that much oxygen is contained during film formation, so that a film containing much oxygen (preferably including a region where the oxygen content is higher than that in the stoichiometric composition of the oxide semiconductor in a crystalline state) is formed.

The gate insulating layer 402 and the oxide semiconductor film 441 are preferably formed in succession without exposure to the air. When the gate insulating layer 402 and the oxide semiconductor film 441 are formed in succession without exposure to the air, impurities such as hydrogen and moisture can be prevented from being adsorbed onto a surface of the gate insulating layer 402.

Next, rare gas ions 421 are implanted to the oxide semiconductor film 441 (see FIG. 1B).

As a method for implanting the rare gas ions 421, a method is used by which the rare gas ions 421 can be implanted to the oxide semiconductor film 441 or to the oxide semiconductor film 441 and interface surfaces thereof, that is, at least to the oxide semiconductor film 441. A method for manufacturing a semiconductor device according to one embodiment of the disclosed invention enables hydrogen to easily detach from the oxide semiconductor film 441 by implanting rare gas ions to the oxide semiconductor film 441 (and interface surfaces thereof) for forming a void inside the film and cutting a bond between a metal contained in the oxide semiconductor film 441 and hydrogen. Accordingly, plasma treatment or the like in which only a surface (interface surface) of the oxide semiconductor film 441 is exposed to rare gas ions is not a suitable method because in plasma treatment or the like, the rare gas ions are introduced only into the surface and the vicinity thereof and the void is not formed in the film (inside the film).

As a method for implanting the rare gas ions 421, which can be used for a method for manufacturing a semiconductor device according to one embodiment of the disclosed invention, for example, an ion implantation method or an ion doping method can be used. In an ion implantation method, a source gas is made into plasma, ion species included in this plasma are extracted and mass-separated, and ion species with predetermined mass are accelerated and implanted to an object to be processed as an ion beam. In an ion doping method, a source gas is made into plasma, ion species are extracted from this plasma by operation of a predetermined electric field, and the extracted ion species are accelerated without mass separation and implanted to an object to be processed as an ion beam. When the implantation of rare gas ions is performed using an ion implantation method involving mass-separation, impurities such as a metal element can be prevented from being added, together with the rare gas ions, to the oxide semiconductor film. On the other hand, an ion doping method enables ion-beam irradiation to a larger area than an ion implantation method, and thus, when the implantation of rare gas ions is performed using an ion doping method, the takt time can be shortened.

Alternatively, as a method for implanting the rare gas ions 421, which can be used for a method for manufacturing a semiconductor device according to one embodiment of the disclosed invention, a plasma immersion ion implantation method may be used. By a plasma immersion ion implantation method, rare gas ions can be implanted efficiently even when the oxide semiconductor film 441 has an uneven shape. A plasma immersion ion implantation method is preferably used, for example, in the case where the oxide semiconductor film 441 is formed three-dimensionally so as to cover a depression or a projection of a region where the oxide semiconductor film 441 is formed.

FIG. 1B illustrates an example where a surface of the oxide semiconductor film 441 is exposed in the step of implanting the rare gas ions 421. In the step of implanting the rare gas ions 421, the rare gas ions 421 may be implanted to the oxide semiconductor film 441 on which another film (e.g., an insulating film) is stacked, through the stacked film. When the rare gas ions 421 are implanted to the oxide semiconductor film 441 through the stacked film, a rare gas ion implantation depth (implantation region) can be more easily controlled and thus, the rare gas ions 421 can be implanted efficiently to the oxide semiconductor film 441, which is an advantage.

The depth at which the rare gas ions 421 are implanted can be controlled by appropriately setting an implantation condition such as acceleration voltage or a dose, or the thickness of a film to which the rare gas ions 421 are implanted. For example, in the case where a rare gas is used and rare gas ions are implanted by an ion implantation method, the dose can be greater than or equal to $1\times10^{14}$ ions/cm$^2$ and less than or equal to $5\times10^{16}$ ions/cm$^2$.

The rare gas ions 421 are implanted to the oxide semiconductor film 441 as described above, so that an oxide semiconductor film 442 to which a rare gas element is implanted is formed (see FIG. 1B).

It is preferable that a peak of the concentration of the implanted rare gas element in the oxide semiconductor film 442 to which a rare gas element is implanted be greater than or equal to $1\times10^{19}$ atoms/cm$^3$ and less than or equal to $3\times10^{22}$ atoms/cm$^3$ (more preferably, greater than or equal to $1\times10^{20}$ atoms/cm$^3$ and less than or equal to $3\times10^{21}$ atoms/cm$^3$).

One or more kinds of rare gas elements (preferably argon, krypton, xenon, or the like) are used in the implantation step. In the case of using a plurality of kinds of rare gas elements, the concentration of implanted rare gas elements is the total concentration of the plurality of kinds of implanted rare gas elements.

Note that the concentration of the rare gas element can be measured by analysis using secondary ion mass spectrometry (SIMS).

Next, the oxide semiconductor film 442 to which rare gas ions are implanted is subjected to a heating step.

The heating step is performed at a temperature higher than or equal to 300° C. and lower than or equal to 700° C. or lower than the strain point of the substrate. For example, the substrate is introduced into an electric furnace which is one of heat treatment apparatuses, and the heating step is performed on the oxide semiconductor film at 450° C. for one hour in a nitrogen atmosphere.

Note that the heat treatment apparatus is not limited to an electric furnace, and an apparatus for heating an object to be processed by heat conduction or heat radiation from a heating element such as a resistance heating element may be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heating step, GRTA may be performed as follows: the substrate is put in an inert gas heated to a high temperature of 650° C. to 700° C., heated for several minutes, and taken out of the inert gas.

The heating step may be performed under reduced pressure, in a nitrogen atmosphere, or in a rare gas atmosphere. It is preferable that water, hydrogen, and the like be not contained in the atmosphere of nitrogen, a rare gas, or the like. It is also preferable that the purity of nitrogen or a rare gas which is introduced into a heat treatment apparatus be set to be a purity of 6 N (99.9999%) or higher, preferably 7 N (99.99999%) or higher (that is, the impurity concentration is 1 ppm or lower, preferably 0.1 ppm or lower).

By the implantation of rare gas ions to the oxide semiconductor film, a bond between hydrogen and an element (e.g., a metal element) included in the oxide semiconductor is cut. Thus, hydrogen which is an impurity can be easily detached from the oxide semiconductor film by a heating step which is performed after the implantation of rare gas ions. Further, since a void (defect) is formed in the film by the implantation of rare gas ions, hydrogen after the bond is cut can be easily detached from the film via the void.

Further, a bond between a hydroxyl group and an element (e.g., a metal element) included in the oxide semiconductor is also cut by the implantation of rare gas ions to the oxide semiconductor film. Thus, in some cases, hydrogen is detached from the oxide semiconductor film as water as a result of bonding between hydrogen after the bond is cut and a hydroxyl group after the bond is cut.

Through the rare gas ion implantation step and the heating step, the oxide semiconductor film 441 can be efficiently dehydrated or dehydrogenated and an impurity such as hydrogen or water is removed, whereby a highly purified oxide semiconductor film 443 can be formed (see FIG. 1C).

The oxide semiconductor film is highly purified by removing hydrogen, which is an n-type impurity, from the oxide semiconductor film so that impurities are contained as few as possible, and then oxygen is sufficiently supplied to the oxide semiconductor film; thus, an i-type (intrinsic) or substantially i-type (intrinsic) oxide semiconductor film can be obtained.

In the heating step where dehydration or dehydrogenation treatment is performed, it is preferable that a surface of the oxide semiconductor film be not in a state where hydrogen, water, or the like is prevented from being released (for example, by providing a film or the like which is not permeable to (or blocks) hydrogen, water, or the like), but in a state where the surface of the oxide semiconductor film is exposed. In the case where a film is formed on the oxide semiconductor film in the implantation step, the film on the oxide semiconductor film may be removed so that the surface of the oxide semiconductor film is exposed.

When the film formed on the oxide semiconductor film is permeable to (or does not block) hydrogen, water, and the like and water and the like are not prevented from being released, the heating step may be performed in a state where the film is formed on the oxide semiconductor film.

The implanting step may be performed on an oxide semiconductor film in a film form as in FIG. 1B or may be performed on an oxide semiconductor film after processed into an island shape by a photolithography process. The heating step may be performed on an oxide semiconductor film in a film form as in FIG. 1C or may be performed on an oxide semiconductor film after processed into an island shape by a photolithography process. As in this embodiment, the heating step is preferably performed before the oxide semiconductor film 442 is processed into an island shape because oxygen contained in the gate insulating layer 402 can be prevented from being released by the heating step.

In the case where the oxide semiconductor film 441 is a CAAC-OS film, a crystal structure in the oxide semiconductor film 441 is disordered by the rare gas ion implantation step and the crystalline portion is made amorphous in some cases; however, the amorphous portion can be crystallized by performing the heating step under conditions (an atmosphere and a heating temperature) for crystallization after the rare gas ion implantation step is performed.

Next, the oxide semiconductor film 443 is processed into the island-shaped oxide semiconductor film 403 by a second photolithography process (see FIG. 1D). A resist mask for forming the island-shaped oxide semiconductor film 403 may be formed by an inkjet method. Formation of the resist mask by an inkjet method needs no photomask; thus, manufacturing cost can be reduced.

Note that in one embodiment of the disclosed invention, the oxide semiconductor film may be processed into an island shape as in this embodiment, or may be in a film form without being processed.

Note that the etching of the oxide semiconductor film 443 may be dry etching, wet etching, or both dry etching and wet etching. An etchant used for wet etching of the oxide semiconductor film 443, for example, can be selected as appropriate depending on the oxide semiconductor material. For example, a mixed solution of phosphoric acid, acetic acid, and nitric acid, an ammonia hydrogen peroxide mixture (hydrogen peroxide water of 31 wt %: ammonia water of 28 wt %: water=5:2:2), or the like can be used. Alternatively, ITO-07N (produced by KANTO CHEMICAL CO., INC.) may be used.

Next, a conductive film for forming the source electrode layer and the drain electrode layer (including a wiring formed in the same layer as the source electrode layer and the drain electrode layer) is formed over the gate insulating layer 402 and the oxide semiconductor film 403. As the conductive film for forming the source electrode layer and the drain electrode layer, for example, a metal film containing an element selected from Al, Cr, Cu, Ta, Ti, Mo, and W; a metal nitride film containing any of the above elements as its component (e.g., a titanium nitride film, a molybdenum nitride film, or a tungsten nitride film); or the like can be used. Alternatively, a film of a high-melting-point metal such as Ti, Mo, or W or a metal nitride film thereof (e.g., a titanium nitride film, a molybdenum nitride film, or a tungsten nitride film) may be formed over or/and below a metal film such as an Al film or a Cu film. Further alternatively, the conductive film for forming the source electrode layer and the drain electrode layer may be formed using a conductive metal oxide. As the conductive metal oxide, indium oxide, tin oxide, zinc oxide, indium oxide-tin oxide, indium oxide-zinc oxide, or any of these metal oxide materials in which silicon oxide is contained can be used.

In a third photolithography process, a resist mask is formed over the conductive film and selective etching is performed, so that the source electrode layer 405a and the drain electrode layer 405b are formed. Then, the resist mask is removed (see FIG. 1E).

Light exposure at the time of the formation of the resist mask in the third photolithography process may be performed using ultraviolet light, KrF laser light, or ArF laser light. A channel length L of the transistor to be formed later is determined by a distance between a lower end of the source electrode layer and a lower end of the drain electrode layer that are adjacent to each other over the oxide semiconductor film 403. In the case where light exposure is performed for a channel length L of less than 25 nm, the light exposure at the time of the formation of the resist mask in the third photolithography process may be performed using extreme ultraviolet light having an extremely short wavelength of several nanometers to several tens of nanometers. In the light exposure using extreme ultraviolet light, the resolution is high and the focus depth is large. For these reasons, the channel length L of the transistor to be formed later can be greater than or equal to 10 nm and less than or equal to 1000 nm, and the circuit can operate at higher speed.

In order to reduce the number of photomasks and the number of steps in the photolithography process, an etching step may be performed with the use of a resist mask formed using a multi-tone mask which is a light-exposure mask through which light is transmitted to have a plurality of intensities. A resist mask formed using a multi-tone mask has a plurality of thicknesses and further can be changed in shape by etching; therefore, the resist mask can be used in a plurality of etching steps for processing into different patterns. Accordingly, a resist mask corresponding to at least two kinds of different patterns can be formed by using one multi-tone mask. Thus, the number of light-exposure masks can be reduced and the number of corresponding photolithography process can also be reduced, whereby simplification of a process can be achieved.

Note that it is preferable that etching conditions be optimized so as not to etch and divide the oxide semiconductor film 403 when the conductive film is etched. However, it is difficult to obtain etching conditions in which only the conductive film is etched and the oxide semiconductor film 403 is not etched at all. In some cases, only part of the oxide semiconductor film 403 is etched when the conductive film is etched, so that an oxide semiconductor film having a groove portion (a recessed portion) is formed.

In this embodiment, since a Ti film is used as the conductive film and an In—Ga—Zn—O-based oxide semiconductor is used for the oxide semiconductor film 403, an ammonium hydrogen peroxide mixture (a mixture of ammonia, water, and hydrogen peroxide) is used as an etchant.

Next, by plasma treatment using a gas such as $N_2O$, $N_2$, or Ar, water or the like adsorbed to a surface of an exposed portion of the oxide semiconductor film 403 may be removed. In the case where plasma treatment is performed, the insulating layer 407 in contact with part of the oxide semiconductor film 403 is formed without exposure to the air.

The insulating layer 407 can be formed to a thickness of at least 1 nm by using a method with which impurities such as water and hydrogen do not enter the insulating layer 407, such as a sputtering method, as appropriate. When hydrogen is contained in the insulating layer 407, entry of the hydrogen into the oxide semiconductor film or extraction of oxygen from the oxide semiconductor film by the hydrogen is caused; thus, a back channel of the oxide semiconductor film might come to have low resistance (n-type conductivity) and a parasitic channel might be formed. Accordingly, it is important that a film formation method in which hydrogen is not used is employed, such that the insulating layer 407 contains as little hydrogen as possible.

As the insulating layer 407, a single layer or a stack using one or more inorganic insulating films typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film can be used.

Oxygen is preferably supplied to the oxide semiconductor film 403 which is subjected to the rare gas ion implantation step and the heating step for dehydration or dehydrogenation treatment. By supply of oxygen to the oxide semiconductor film 403, oxygen defects in the film can be filled.

In this embodiment, oxygen is supplied to the oxide semiconductor film 403 using the insulating layer 407 as a supply source, and thus an example where an oxide insulating film (e.g., a silicon oxide film or a silicon oxynitride film) containing oxygen is used as the insulating layer 407 is described. In the case where the insulating layer 407 is used as a supply source of oxygen, the insulating layer 407 can favorably function as the supply source of oxygen when being a film containing much (excessive) oxygen (preferably, a film including a region where the oxygen content is higher than that in the stoichiometric composition of the oxide semiconductor in a crystalline state).

In this embodiment, as the insulating layer 407, a silicon oxide film having a thickness of 300 nm is formed by a sputtering method. The substrate temperature at the time of film formation may be higher than or equal to room temperature and lower than or equal to 300° C. and in this embodiment, is 100° C. The silicon oxide film can be formed by a sputtering method in a rare gas (typically, argon) atmosphere, an oxygen atmosphere, or a mixed atmosphere containing a rare gas and oxygen. As a target, a silicon oxide target or a silicon target can be used. For example, the silicon oxide film can be formed using a silicon target by a sputtering method in an atmosphere containing oxygen.

As in the case where the oxide semiconductor film is formed, an entrapment vacuum pump (such as a cryopump) is preferably used in order to remove moisture remaining in a deposition chamber for the insulating layer 407. When the insulating layer 407 is formed in the deposition chamber evacuated using a cryopump, the concentration of impurities contained in the insulating layer 407 can be reduced. In addition, as an evacuation unit for removing the moisture remaining in the deposition chamber for the insulating layer 407, a turbo molecular pump provided with a cold trap may be used.

It is preferable to use a high-purity gas from which an impurity such as hydrogen or water is removed as a sputtering gas for the formation of the insulating layer 407.

Next, the oxide semiconductor film part of which (a channel formation region) is in contact with the insulating layer 407 is subjected to a heating step.

The heating step is performed at a temperature higher than or equal to 250° C. and lower than or equal to 700° C., preferably higher than or equal to 400° C. and lower than or equal to 700° C. or lower than the strain point of the substrate. For example, the substrate is introduced into an electric furnace which is one of heat treatment apparatuses, and the heating step is performed on the oxide semiconductor film at 250° C. for one hour in a nitrogen atmosphere.

For the heating step, a heating method and a heating apparatus similar to those for the heating step where dehydration or dehydrogenation treatment is performed.

The heating step may be performed under reduced pressure, in a nitrogen atmosphere, in an oxygen atmosphere, in ultra-dry air (air in which the moisture amount is less than or equal to 20 ppm (−55 ° C. by conversion into a dew point), preferably less than or equal to 1 ppm, more preferably less than or equal to 10 ppb, in the measurement with the use of a dew point meter in the cavity ring down laser spectroscopy (CRDS) system), or in a rare gas (argon, helium, or the like) atmosphere. It is preferable that water, hydrogen, and the like be not contained in the nitrogen atmosphere, in the oxygen atmosphere, in the ultra-dry air, in the rare gas atmosphere, or the like. It is also preferable that the purity of nitrogen, oxygen, or a rare gas which is introduced into a heat treatment apparatus be set to be 6 N (99.9999%) or higher, preferably 7 N (99.99999%) or higher (that is, the impurity concentration is 1 ppm or lower, preferably 0.1 ppm or lower).

The oxide semiconductor film 403 and the insulating layer 407 containing oxygen are in contact with each other when being subjected to the heating step; thus, oxygen which is one of the main components of the oxide semiconductor film 403 and is reduced in the step of removing an impurity, can be supplied from the insulating layer 407 containing oxygen to the oxide semiconductor film 403.

The oxide semiconductor film 403 includes extremely few (close to zero) carriers. The carrier concentration of the oxide semiconductor film 403 is less than $1\times10^{14}/cm^3$, preferably less than $1\times10^{12}/cm^3$, more preferably less than $1\times10^{11}/cm^3$.

Through the above steps, the transistor 410 including the electrically i-type (intrinsic) oxide semiconductor film 403 obtained by sufficiently supplying oxygen to the highly purified oxide semiconductor film is formed (see FIG. 1F). Variation in the electric characteristics of the transistor 410 is suppressed and the transistor 410 is electrically stable.

An insulating layer may be additionally stacked over the insulating layer 407. Particularly in the case where an oxide insulating layer is used as the insulating layer 407, it is preferable to form a protective insulating layer, over the insulating layer 407, for blocking entry of impurities such as moisture and hydrogen into the oxide semiconductor film 403. For the protective insulating layer, an inorganic insulating film, examples of which are a silicon nitride film, an aluminum oxide film, a silicon nitride oxide film, an aluminum nitride film, and an aluminum nitride oxide film, is used. For example, an aluminum oxide film having a high shielding effect (blocking effect), which is not permeable to either oxygen or impurities such as hydrogen and moisture can be used.

The heating step after the formation of the insulating layer 407 may be performed after the protective insulating layer is stacked over the insulating layer 407.

A heating step may be additionally performed after the protective insulating layer is formed. For example, a heating step may be performed at a temperature higher than or equal to 100° C. and lower than or equal to 200° C. in the air for longer than or equal to 1 hour and shorter than or equal to 30 hours. This heating step may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature.

In addition, a planarization insulating film may be formed over the transistor 410 in order that surface unevenness due to the transistor 410 is reduced. For the planarization insulating film, an organic material such as polyimide, acrylic, or benzocyclobutene can be used. Other than such organic materials, it is also possible to use a low-dielectric constant material (low-k material) or the like. Note that the planarization insulating film may be formed by stacking a plurality of insulating films formed using any of these materials.

In the transistor 410 using the highly purified oxide semiconductor film 403 formed in accordance with this embodiment, a value of a current in an off state (a value of an off-state current) per micrometer in channel width can be reduced to less than 10 zA/µm at room temperature and less than 100 zA/µm at 85° C.

As described above, a semiconductor device including an oxide semiconductor, which has stable electric characteristics, can be provided. Thus, a highly reliable semiconductor device can be provided.

(Embodiment 2)

In this embodiment, another embodiment of a semiconductor device will be described with reference to FIGS. 2A to 2F. The same portions as or portions having functions similar to those in the above embodiment can be formed in a manner similar to those described in the above embodiment, and steps similar to those in the above embodiment can be performed in a manner similar to that described in the above embodiment; thus repetitive description is omitted. In addition, detailed description of the same portions is omitted.

Figure 2A:
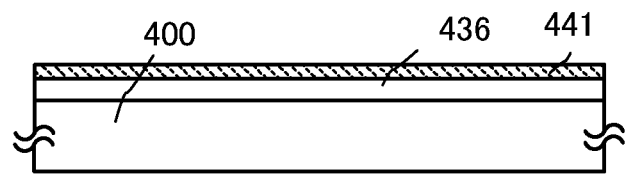
FIGS. 2A to 2F are diagrams illustrating one embodiment of a semiconductor device and a method for manufacturing the semiconductor device.
Figure 2B:
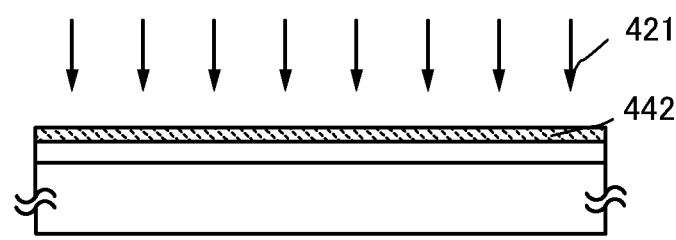
Figure 2C:
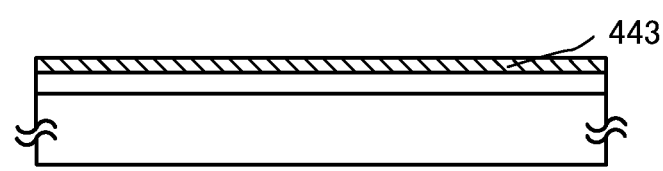
Figure 2D:
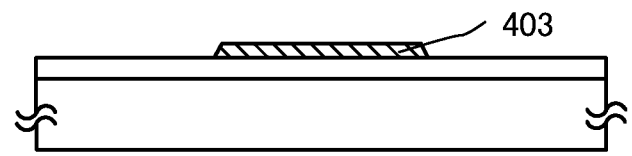
Figure 2E:
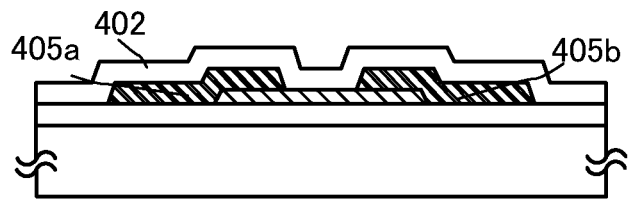
Figure 2F:
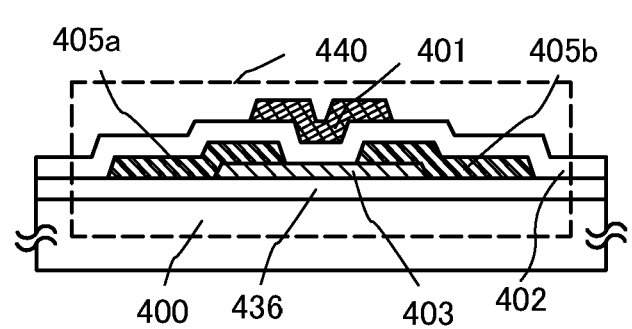

A transistor 440 illustrated in FIG. 2F is an example of a top-gate transistor.

As illustrated in FIG. 2F, the transistor 440 includes, over the substrate 400 having an insulating surface over which an insulating layer 436 is formed, the oxide semiconductor film 403, the source electrode layer 405a, the drain electrode layer 405b, the gate insulating layer 402, and the gate electrode layer 401.

FIGS. 2A to 2F illustrate an example of a method for manufacturing the transistor 440.

First, the insulating layer 436 is formed over the substrate 400 having an insulating surface. The insulating layer 436 may be formed using a material and a method similar to those of the insulating layer 407.

As the insulating layer 436, a single layer or a stack using one or more inorganic insulating films typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film can be used.

As described in Embodiment 1, when the insulating layer 436 in contact with the oxide semiconductor film 403 (or a film in contact with the oxide semiconductor film 403 in the case where the insulating layer 436 has a stacked-layer structure) contains much oxygen, the insulating layer 436 (or the film in contact with the oxide semiconductor film 403) can favorably function as a supply source which supplies oxygen to the oxide semiconductor film 403.

In this embodiment, as the insulating layer 436, an insulating layer containing oxygen is used. A silicon oxide film having a thickness of 200 nm is formed by a sputtering method.

Next, the oxide semiconductor film 441 is formed over the insulating layer 436 (see FIG. 2A). In this embodiment, an In—Ga—Zn—O-based oxide film is formed using an In—Ga—Zn—O-based oxide target by a sputtering method. Note that it is preferable that the oxide semiconductor film 441 be formed under a condition that the obtained oxide semiconductor film 441 by film formation contains much (excessive) oxygen.

The insulating layer 436 and the oxide semiconductor film 441 are preferably formed in succession without exposure to the air. When the insulating layer 436 and the oxide semiconductor film 441 are formed in succession without exposure to the air, impurities such as hydrogen and moisture can be prevented from being adsorbed onto a surface of the insulating layer 436.

Then, the rare gas ions 421 are implanted to the oxide semiconductor film 441 and thus, the oxide semiconductor film 442 to which a rare gas element is implanted is formed (see FIG. 2B).

As a method for implanting the rare gas ions 421, a method is used by which the rare gas ions 421 can be implanted to the oxide semiconductor film 441 or to the oxide semiconductor film 441 and interface surfaces thereof, that is, at least to the oxide semiconductor film 441. A method for manufacturing a semiconductor device according to one embodiment of the disclosed invention enables hydrogen to easily detach from the oxide semiconductor film 441 by implanting rare gas ions to the oxide semiconductor film 441 (and interface surfaces thereof) for forming a void inside the film and cutting a bond between a metal contained in the oxide semiconductor film 441 and hydrogen.

As a method for implanting the rare gas ions 421, which can be used for a method for manufacturing a semiconductor device according to one embodiment of the disclosed invention, for example, an ion implantation method or an ion doping method can be used. A plasma immersion ion implantation method may also be used.

FIG. 2B illustrates an example where a surface of the oxide semiconductor film 441 is exposed in a step of implanting the rare gas ions 421.

The depth at which the rare gas ions 421 are implanted can be controlled by appropriately setting an implantation condition such as acceleration voltage or a dose, or the thickness of a film to which the rare gas ions 421 are implanted. For example, in the case where a rare gas is used and rare gas ions are implanted by an ion implantation method, the dose can be greater than or equal to $1 \times 10^{14}$ ions/cm$^2$ and less than or equal to $5 \times 10^{16}$ ions/cm$^2$.

It is preferable that a peak of the concentration of the implanted rare gas element in the oxide semiconductor film 442 to which a rare gas element is implanted be greater than or equal to $1 \times 10^{19}$ atoms/cm$^3$ and less than or equal to $3 \times 10^{22}$ atoms/cm$^3$ (more preferably, greater than or equal to $1 \times 10^{20}$ atoms/cm$^3$ and less than or equal to $3 \times 10^{21}$ atoms/cm$^3$).

One or more kinds of rare gas elements (preferably argon, krypton, xenon, or the like) are used in the implantation step. In the case of using a plurality of kinds of rare gas elements, the concentration of implanted rare gas elements is the total concentration of the plurality of kinds of implanted rare gas elements.

Next, the oxide semiconductor film 442 to which rare gas ions are implanted is subjected to a heating step.

The heating step is performed at a temperature higher than or equal to 300° C. and lower than or equal to 700° C. or lower than the strain point of the substrate. For example, the substrate is introduced into an electric furnace which is one of heat treatment apparatuses, and the heating step is performed on the oxide semiconductor film at 450° C. for one hour in a nitrogen atmosphere.

The heating step may be performed under reduced pressure, in a nitrogen atmosphere, or in a rare gas atmosphere. It is preferable that water, hydrogen, and the like be not contained in the atmosphere of nitrogen, a rare gas, or the like. It is also preferable that the purity of nitrogen or a rare gas which is introduced into a heat treatment apparatus be set to be a purity of 6 N (99.9999%) or higher, preferably 7 N (99.99999%) or higher (that is, the impurity concentration is 1 ppm or lower, preferably 0.1 ppm or lower).

By the implantation of rare gas ions to the oxide semiconductor film, a bond between hydrogen and an element (e.g., a metal element) included in the oxide semiconductor is cut. Thus, hydrogen which is an impurity can be easily detached from the oxide semiconductor film by a heating step which is performed after the implantation of rare gas ions. Further, since a void (defect) is formed in the film by the implantation of rare gas ions, hydrogen after the bond is cut can be easily detached from the film via the void.

Further, a bond between a hydroxyl group and an element (e.g., a metal element) included in the oxide semiconductor is also cut by the implantation of rare gas ions to the oxide semiconductor film. Thus, in some cases, hydrogen is detached from the oxide semiconductor film as water as a result of bonding between hydrogen after the bond is cut and a hydroxyl group after the bond is cut.

Through the rare gas ion implantation step and the heating step, dehydration or dehydrogenation of the oxide semiconductor film 441 can be efficiently performed and an impurity such as hydrogen or water is removed, whereby a highly purified oxide semiconductor film 443 can be formed (see FIG. 2C).

The oxide semiconductor film is highly purified by removing hydrogen, which is an n-type impurity, from the oxide semiconductor film so that impurities are contained as few as possible, and then oxygen is sufficiently supplied to the oxide semiconductor film; thus, an i-type (intrinsic) or substantially i-type (intrinsic) oxide semiconductor film can be obtained.

In the heating step where dehydration or dehydrogenation treatment is performed, it is preferable that a surface of the oxide semiconductor film be not in a state where hydrogen, water, or the like is prevented from being released (for example, by providing a film or the like which is not permeable to (or blocks) hydrogen, water, or the like), but in a state where the surface of the oxide semiconductor film is exposed. In the case where a film is formed on the oxide semiconductor film in the implantation step, the film on the oxide semiconductor film may be removed so that the surface of the oxide semiconductor film is exposed.

When the film formed on the oxide semiconductor film is permeable to (or does not block) hydrogen, water, and the like and water and the like are not prevented from being released, the heating step may be performed in a state where the film is formed on the oxide semiconductor film.

The implanting step may be performed on an oxide semiconductor film in a film form as in FIG. 2B or may be performed on an oxide semiconductor film after processed into an island shape by a photolithography process. The heating step may be performed on an oxide semiconductor film in a film form as in FIG. 2C or may be performed on an oxide semiconductor film after processed into an island shape by a photolithography process. As in this embodiment, the heating step is preferably performed before the oxide semiconductor film 442 is processed into an island shape because oxygen contained in the insulating layer 436 can be prevented from being released by the heating step.

Next, the oxide semiconductor film 443 is processed into the island-shaped oxide semiconductor film 403 by a second photolithography process (see FIG. 2D).

The source electrode layer 405a and the drain electrode layer 405b are formed over the insulating layer 436 and the oxide semiconductor film 403, and the gate insulating layer 402 is formed over the insulating layer 436, the oxide semiconductor film 403, the source electrode layer 405a, and the drain electrode layer 405b (see FIG. 2E). As the gate insulating layer 402, an insulating layer formed by a sputtering method or a plasma CVD method is used. In this embodiment, a silicon oxynitride film formed by a plasma CVD method is used as the gate insulating layer 402. The gate insulating layer 402 may be a supply source of oxygen for the oxide semiconductor film 403 and in that case, an insulating film containing much oxygen is formed as the gate insulating layer 402.

Oxygen is preferably supplied to the oxide semiconductor film 403 which is subjected to the rare gas ion implantation step and the heating step for dehydration or dehydrogenation treatment. By supply of oxygen to the oxide semiconductor film 403, oxygen defects in the film can be filled.

In this embodiment, oxygen is supplied to the oxide semiconductor film 403 using the insulating layer 436 as a supply source.

In this embodiment, the heating step is performed in a state where the oxide semiconductor film 403 and the insulating layer 436 are in contact with each other.

The heating step is performed at a temperature higher than or equal to 250° C. and lower than or equal to 700° C., preferably higher than or equal to 400° C. and lower than or equal to 700° C. or lower than the strain point of the substrate. For example, the substrate is introduced into an electric furnace which is one of heat treatment apparatuses, and the heating step is performed on the oxide semiconductor film at 250 20 C. for one hour in a nitrogen atmosphere.

The oxide semiconductor film 403 and the insulating layer 436 containing oxygen are in contact with each other when being subjected to the heating step; thus, oxygen which is one of the main components of the oxide semiconductor film 403 and is reduced in the step of removing an impurity, can be supplied from the insulating layer 436 containing oxygen to the oxide semiconductor film 403.

The highly purified oxide semiconductor film 403 includes extremely few (close to zero) carriers. The carrier concentration of the oxide semiconductor film 403 is less than $1\times10^{14}/cm^3$, preferably less than $1\times10^{12}/cm^3$, more preferably less than $1\times10^{11}/cm^3$.

Next, the gate electrode layer 401 is formed over the gate insulating layer 402 which overlaps with the oxide semiconductor film 403 (see FIG. 2F).

Note that the heating step for supplying oxygen to the oxide semiconductor film 403 may be performed after the gate electrode layer 401 is formed.

Through the above steps, the transistor 440 including the electrically i-type (intrinsic) oxide semiconductor film 403 obtained by sufficiently supplying oxygen to the highly purified oxide semiconductor film is formed (see FIG. 2F). Variation in the electric characteristics of the transistor 440 is suppressed and the transistor 440 is electrically stable.

An insulating layer may be formed over the transistor 440. As the insulating layer, a single layer or a stack using one or more inorganic insulating films typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film can be used.

In addition, a planarization insulating film may be formed over the transistor 440 in order that surface unevenness due to the transistor 440 is reduced. For the planarization insulating film, an organic material such as polyimide, acrylic, or benzocyclobutene can be used. Other than such organic materials, it is also possible to use a low-dielectric constant material (low-k material) or the like. Note that the planarization insulating film may be formed by stacking a plurality of insulating films formed using any of these materials.

In the transistor 440 using the highly purified oxide semiconductor film 403 formed in accordance with this embodiment, a value of a current in an off state (a value of an off-state current) per micrometer in channel width can be reduced to less than 10 zA/µm at room temperature and less than 100 zA/µm at 85° C.

As described above, a semiconductor device including an oxide semiconductor, which has stable electric characteristics, can be provided. Thus, a highly reliable semiconductor device can be provided.

This embodiment can be implemented in combination with other embodiments as appropriate.

(Embodiment 3)

In this embodiment, another embodiment of a semiconductor device will be described with reference to FIGS. 4A to 4C. In this embodiment, a transistor will be described as an example of the semiconductor device. The same portions as or portions having functions similar to those in the above embodiments can be formed in a manner similar to those described in the above embodiments, and steps similar to those in the above embodiment can be performed in a manner similar to that described in the above embodiments; thus repetitive description is omitted. In addition, detailed description of the same portions is omitted.

There is no particular limitation on the structure of the transistor; for example, a staggered type transistor or a planar type transistor having a top gate structure or a bottom gate structure can be employed. The transistor may have a single gate structure including one channel formation region, a double gate structure including two channel formation regions, or a triple gate structure including three channel formation regions. Alternatively, the transistor may have a dual gate structure including two gate electrode layers, one of which is provided above a channel region with a gate insulating layer provided therebetween and the other of which is provided below the channel formation region with another gate insulating layer provided therebetween.

Examples of cross-sectional structures of transistors 430, 420, and 450 illustrated in FIGS. 4A to 4C, respectively, will be described below. Similarly to the transistors 410 and 440 described in Embodiment 1 and Embodiment 2, each of the transistors 420, 430, and 450 illustrated in FIGS. 4A to 4C is a transistor including a highly purified oxide semiconductor film obtained by intentional removal of hydrogen or an impurity containing hydrogen such as water from an oxide semiconductor film. Accordingly, variations in the electric characteristics of the transistors 430, 420, and 450 are suppressed and the transistors 430, 420, and 450 are electrically stable. Thus, a highly reliable semiconductor device can be provided.

Figure 4A:
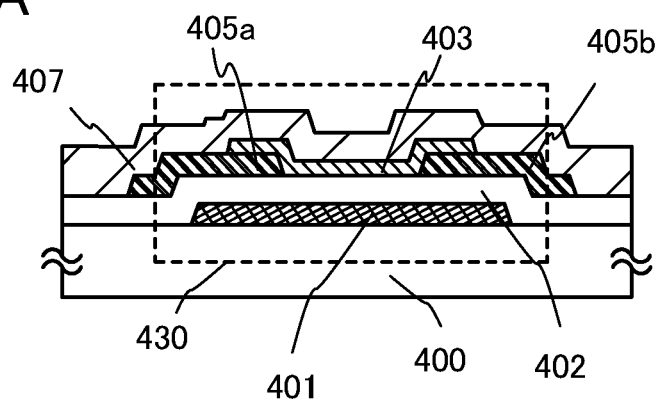
FIGS. 4A to 4C are diagrams each illustrating one embodiment of a semiconductor device.

The transistor 430 illustrated in FIG. 4A is a bottom-gate transistor and includes, over the substrate 400 having an insulating surface, the gate electrode layer 401, the gate insulating layer 402, the source electrode layer 405a, the drain electrode layer 405b, and the oxide semiconductor film 403. The insulating layer 407 which covers the transistor 430 and is in contact with the oxide semiconductor film 403 is provided.

In the transistor 430, the gate insulating layer 402 is provided on and in contact with the substrate 400 and the gate electrode layer 401, and the source electrode layer 405a and the drain electrode layer 405b are provided on and in contact with the gate insulating layer 402. Further, the oxide semiconductor film 403 is provided over the gate insulating layer 402, the source electrode layer 405a, and the drain electrode layer 405b.

Figure 4B:
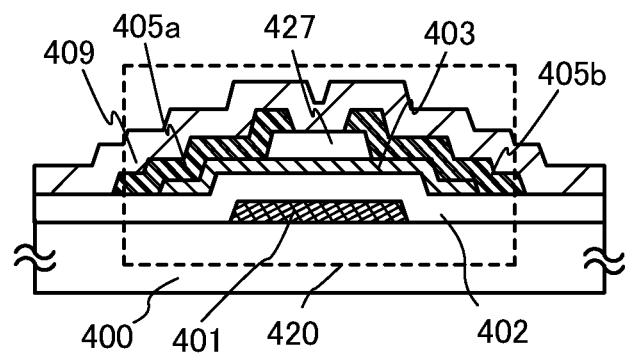

The transistor 420 illustrated in FIG. 4B is one of bottom-gate transistors referred to as a channel-protective (channel-stop) transistor and is also referred to as an inverted staggered transistor.

The transistor 420 includes, over the substrate 400 having an insulating surface, the gate electrode layer 401, the gate insulating layer 402, the oxide semiconductor film 403, an insulating layer 427 functioning as a channel protective layer which covers a channel formation region of the oxide semiconductor film 403, the source electrode layer 405a, and the drain electrode layer 405b. Further, an insulating layer 409 is formed so as to cover the transistor 420.

Each of the insulating layer 427 and the insulating layer 409 may be formed using a material and a method similar to those of the insulating layer 407 and typically, a single layer or a stack using one or more of inorganic insulating films such as a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film can be used.

As described in Embodiment 1, when the insulating layer 427 in contact with the oxide semiconductor film 403 (or a film in contact with the oxide semiconductor film 403 in the case where the insulating layer 427 has a stacked-layer structure) contains much oxygen, the insulating layer 427 (or the film in contact with the oxide semiconductor film 403) can favorably function as a supply source which supplies oxygen to the oxide semiconductor film 403.

Figure 4C:
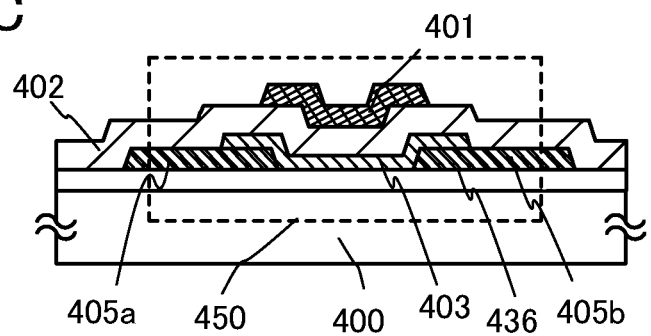

The transistor 450 illustrated in FIG. 4C is one of top-gate transistors. The transistor 450 includes, over the substrate 400 having an insulating surface, the insulating layer 436, the source electrode layer 405a, the drain electrode layer 405b, the oxide semiconductor film 403, the gate insulating layer 402, and the gate electrode layer 401.

In the bottom-gate transistors 420 and 430, an insulating film serving as a base film may be provided between the substrate 400 and the gate electrode layer 401. The base film has a function of preventing diffusion of impurity elements from the substrate, and can be formed to have a single-layer structure or a stacked-layer structure using one or more of a silicon nitride film, a silicon oxide film, a silicon nitride oxide film, and a silicon oxynitride film.

The oxide semiconductor film 403, the substrate 400, the gate electrode layer 401, the gate insulating layer 402, the source electrode layer 405a, and the drain electrode layer 405b can be formed using a material and a method similar to those in Embodiment 1.

In addition, a planarization insulating film may be formed over the transistor in order that surface unevenness due to the transistor is reduced. For the planarization insulating film, an organic material such as polyimide, acrylic, or benzocyclobutene can be used. Other than such organic materials, it is also possible to use a low-dielectric constant material (low-k material) or the like. Note that the planarization insulating film may be formed by stacking a plurality of insulating films formed using any of these materials.

In the transistors 420, 430, and 450, the oxide semiconductor film 403 is a highly purified oxide semiconductor film obtained by intentional removal of hydrogen or an impurity containing hydrogen such as water from an oxide semiconductor film through a rare gas ion implantation step and a heating step after the rare gas ion implantation step.

By the implantation of rare gas ions to the oxide semiconductor film, a bond between hydrogen and an element (e.g., a metal element) included in the oxide semiconductor is cut. Thus, hydrogen which is an impurity can be easily detached from the oxide semiconductor film by a heating step which is performed after the implantation of rare gas ions. Further, since a void (defect) is formed in the film by the implantation of rare gas ions, hydrogen after the bond is cut can be easily detached from the film via the void.

Further, a bond between a hydroxyl group and an element (e.g., a metal element) included in the oxide semiconductor is also cut by the implantation of rare gas ions to the oxide semiconductor film. Thus, in some cases, hydrogen is detached from the oxide semiconductor film as water as a result of bonding between hydrogen after the bond is cut and a hydroxyl group after the bond is cut.

Variation in the electric characteristics of the transistor including the electrically i-type (intrinsic) oxide semiconductor film obtained by sufficiently supplying oxygen to the highly purified oxide semiconductor film is suppressed and the transistor is electrically stable.

In the transistors 420, 430, and 450, the highly purified oxide semiconductor film 403 formed in accordance with this embodiment is used and a value of a current in an off state (a value of an off-state current) per micrometer in channel width can be reduced to less than 10 zA/μm at room temperature and less than 100 zA/μm at 85° C.

As described above, a semiconductor device including an oxide semiconductor, which has stable electric characteristics, can be provided. Thus, a highly reliable semiconductor device can be provided.

(Embodiment 4)

In this embodiment, another embodiment of a method for manufacturing a semiconductor device will be described. The same portions as or portions having functions similar to those in the above embodiments can be formed in a manner similar to those described in the above embodiments, and steps similar to those in the above embodiment can be performed in a manner similar to that described in the above embodiments; thus repetitive description is omitted. In addition, detailed description of the same portions is omitted.

Note that in this embodiment, the transistor 410 described in Embodiment 1 is used as an example; however, any of the transistors 420, 430, 440, and 450 described in Embodiment 2 and Embodiment 3 can also be used.

This embodiment shows, in a method for manufacturing a transistor according to one embodiment of the disclosed invention, an example in which oxygen (which includes at least one of an oxygen radical, an oxygen atom, and an oxygen ion) is introduced into the oxide semiconductor film so that oxygen is supplied to the film which is subjected to the rare gas ion implantation step and the heating step for dehydration or dehydrogenation treatment.

As a method for introducing oxygen, an ion implantation method, an ion doping method, a plasma immersion ion implantation method, plasma treatment, or the like may be used.

Figure 3A:
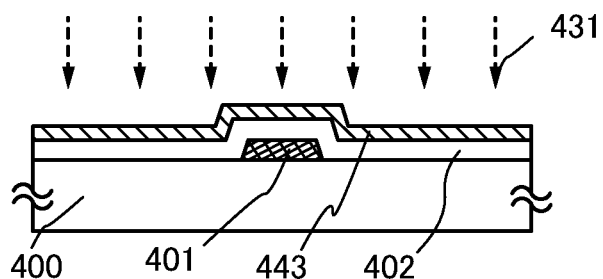
FIGS. 3A to 3D are diagrams each illustrating one embodiment of the method for manufacturing the semiconductor device.

FIG. 3A illustrates an example where after the step shown in FIG. 1C, the oxygen 431 is introduced into the oxide semiconductor film 443 which is subjected to dehydration or dehydrogenation treatment so that the oxygen 431 is supplied to the oxide semiconductor film 443. Oxygen defects in the oxide semiconductor film 443 can be filled with the oxygen 431 supplied to the oxide semiconductor film 443.

Figure 3B:
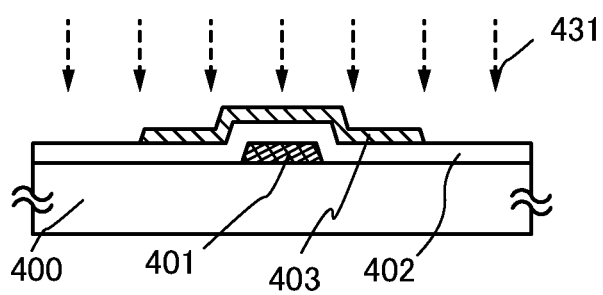

FIG. 3B illustrates an example where after the step shown in FIG. 1D, oxygen 431 is introduced into the oxide semiconductor film 403 obtained by processing the oxide semiconductor film 443 which is subjected to dehydration or dehydrogenation treatment into an island shape so that the oxygen 431 is supplied to the oxide semiconductor film 443. Oxygen defects in the oxide semiconductor film 403 can be filled with the oxygen 431 supplied to the oxide semiconductor film 403.

Figure 3C:
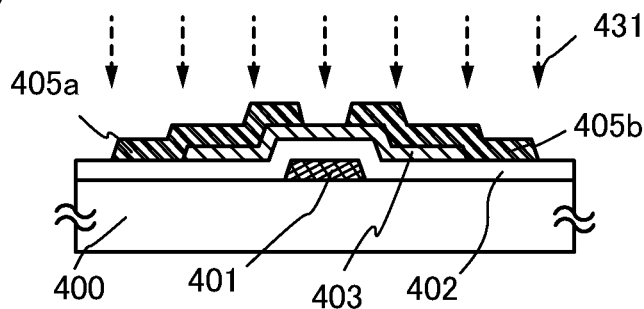

FIG. 3C illustrates an example where after the step shown in FIG. 1E, the oxygen 431 is introduced into the channel formation region of the oxide semiconductor film 403 (a region which is not covered with the source electrode layer 405a or the drain electrode layer 405b and is exposed) so that the oxygen 431 is supplied to the channel formation region of the oxide semiconductor film 403. Oxygen defects in the channel formation region of the oxide semiconductor film 403 can be filled with the oxygen 431 supplied to the oxide semiconductor film 403.

Figure 3D:
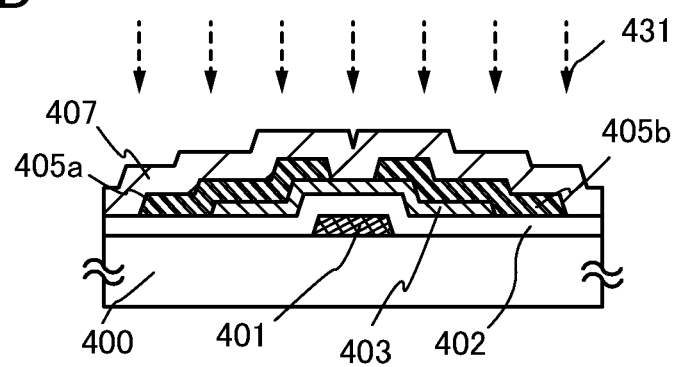

FIG. 3D illustrates an example where after the step shown in FIG. 1F, the oxygen 431 is introduced into the channel formation region of the oxide semiconductor film 403 through the insulating layer 407 formed over the transistor 410 so that the oxygen 431 is supplied to the channel formation region of the oxide semiconductor film 403. Oxygen defects in the channel formation region of the oxide semiconductor film 403 can be filled with the oxygen 431 supplied to the oxide semiconductor film 403. In the case where oxygen is introduced through the insulating layer 407 as illustrated in FIG. 3D, since the oxide semiconductor film 403 is not exposed, not plasma treatment but an ion implantation method, an ion doping method, or a plasma immersion ion implantation method is used.

As described above, oxygen may be introduced into the oxide semiconductor film at any time after dehydration or dehydrogenation treatment is performed by the rare gas ion implantation step and the heating step, and the timing is not particularly limited. Further, oxygen may be introduced plural times into the oxide semiconductor film which is subjected to the dehydration or dehydrogenation treatment.

In the case where oxygen is directly introduced into the oxide semiconductor film as in this embodiment, an insulating layer which is in contact with the oxide semiconductor film does not necessarily contain much oxygen. A film having a high shielding effect (blocking effect) with respect to oxygen, hydrogen, and impurities containing hydrogen such as water is preferably provided as the insulating layer 407 so that oxygen introduced into the oxide semiconductor film is not released from the oxide semiconductor film and hydrogen and impurities containing hydrogen such as water do not enter the oxide semiconductor film. For example, an aluminum oxide film or the like having a high shielding effect (blocking effect) with respect to oxygen and impurities such as hydrogen and moisture may be used.

Needless to say, oxygen may be supplied by a plurality of methods. For example, oxygen may be supplied by using a film containing much oxygen as the insulating layer in contact with the oxide semiconductor film, and by direct introduction of oxygen into oxide semiconductor film.

A heating step is preferably performed after oxygen is introduced into the oxide semiconductor film.

Oxygen is introduced into the oxide semiconductor film which is subjected to the rare gas ion implantation step and the heating step for dehydration or dehydrogenation treatment so that oxygen is supplied to the film, whereby an oxide semiconductor film can be highly purified and electrically i-typed (intrinsic-typed).

Variation in the electric characteristics of the transistor including the electrically i-type (intrinsic) oxide semiconductor film obtained by sufficiently supplying oxygen to the highly purified oxide semiconductor film is suppressed and the transistor is electrically stable.

As described above, a semiconductor device including an oxide semiconductor, which has stable electric characteristics, can be provided. Thus, a highly reliable semiconductor device can be provided.

This embodiment can be implemented in combination with other embodiments as appropriate.

(Embodiment 5)

A semiconductor device with a display function (also referred to as a display device) can be manufactured using the transistor whose example is described in any of Embodiments 1 to 4. Further, part or whole of a driver circuit which includes the transistor can be formed over the same substrate as a pixel portion, whereby a system-on-panel can be obtained.

Figure 6A:
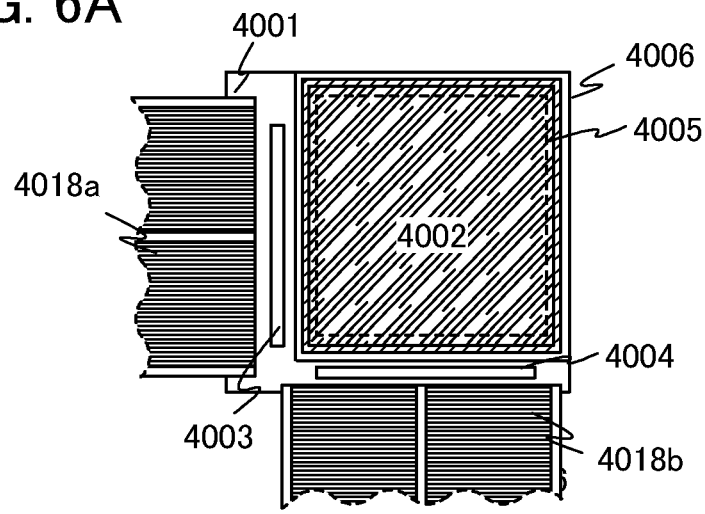
FIGS. 6A to 6C are diagrams each illustrating one embodiment of a semiconductor device.

In FIG. 6A, a sealant 4005 is provided so as to surround a pixel portion 4002 provided over a first substrate 4001, and the pixel portion 4002 is sealed by using a second substrate 4006. In FIG. 6A, a scan line driver circuit 4004 and a signal line driver circuit 4003 each of which is formed using a single crystal semiconductor film or a polycrystalline semiconductor film over a substrate separately prepared are mounted in regions that are different from the region surrounded by the sealant 4005 over the first substrate 4001. A variety of signals and potentials are supplied to the signal line driver circuit 4003 and the scan line driver circuit 4004 each of which is separately formed, and to the pixel portion 4002 from flexible printed circuits (FPCs) 4018a and 4018b.

Figure 6B:
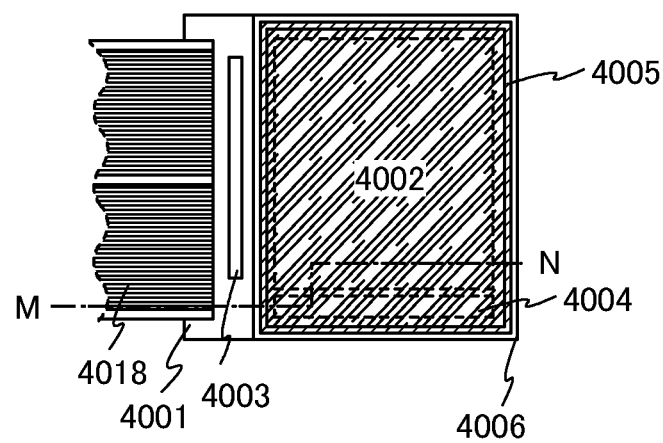
Figure 6C:
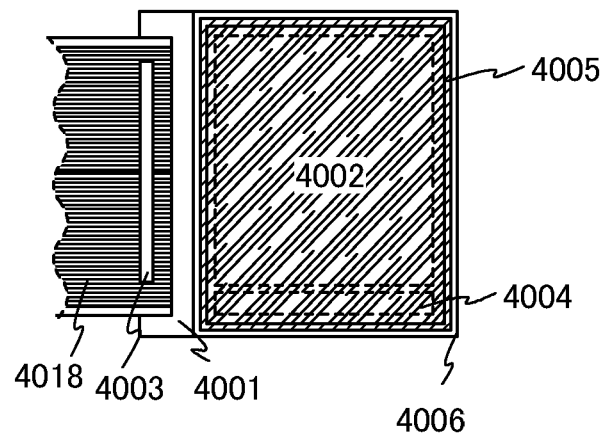

In FIGS. 6B and 6C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 6B and 6C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 6B and 6C, a variety of signals and potentials are supplied to the signal line driver circuit 4003 which is separately formed, the scan line driver circuit 4004, and the pixel portion 4002 from an FPC 4018.

Although FIGS. 6B and 6C each illustrate an example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 6A illustrates an example in which the signal line driver circuit 4003 and the scan line driver circuit 4004 are mounted by a COG method. FIG. 6B illustrates an example in which the signal line driver circuit 4003 is mounted by a COG method. FIG. 6C illustrates an example in which the signal line driver circuit 4003 is mounted by a TAB method.

In addition, the display device includes a panel in which the display element is sealed, and a module in which an IC and the like including a controller are mounted on the panel.

Note that the display device in this specification means an image display device, a display device, or a light source (including a lighting device). Further, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion and the scan line driver circuit which are provided over the first substrate include a plurality of transistors, to which the transistor whose example is described in any of Embodiments 1 to 4 can be applied.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Further, a display medium whose contrast is changed by an electric effect, such as electronic ink, can be used.

Figure 7:
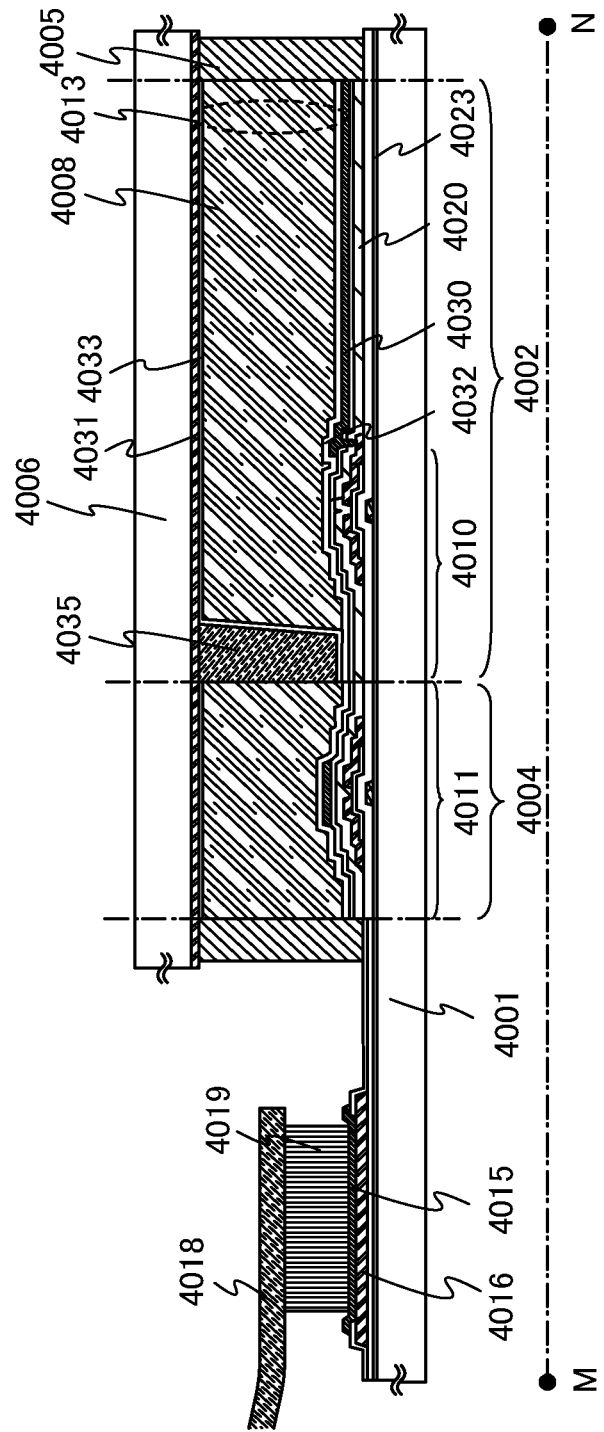
FIG. 7 is a diagram illustrating one embodiment of a semiconductor device.
Figure 8:
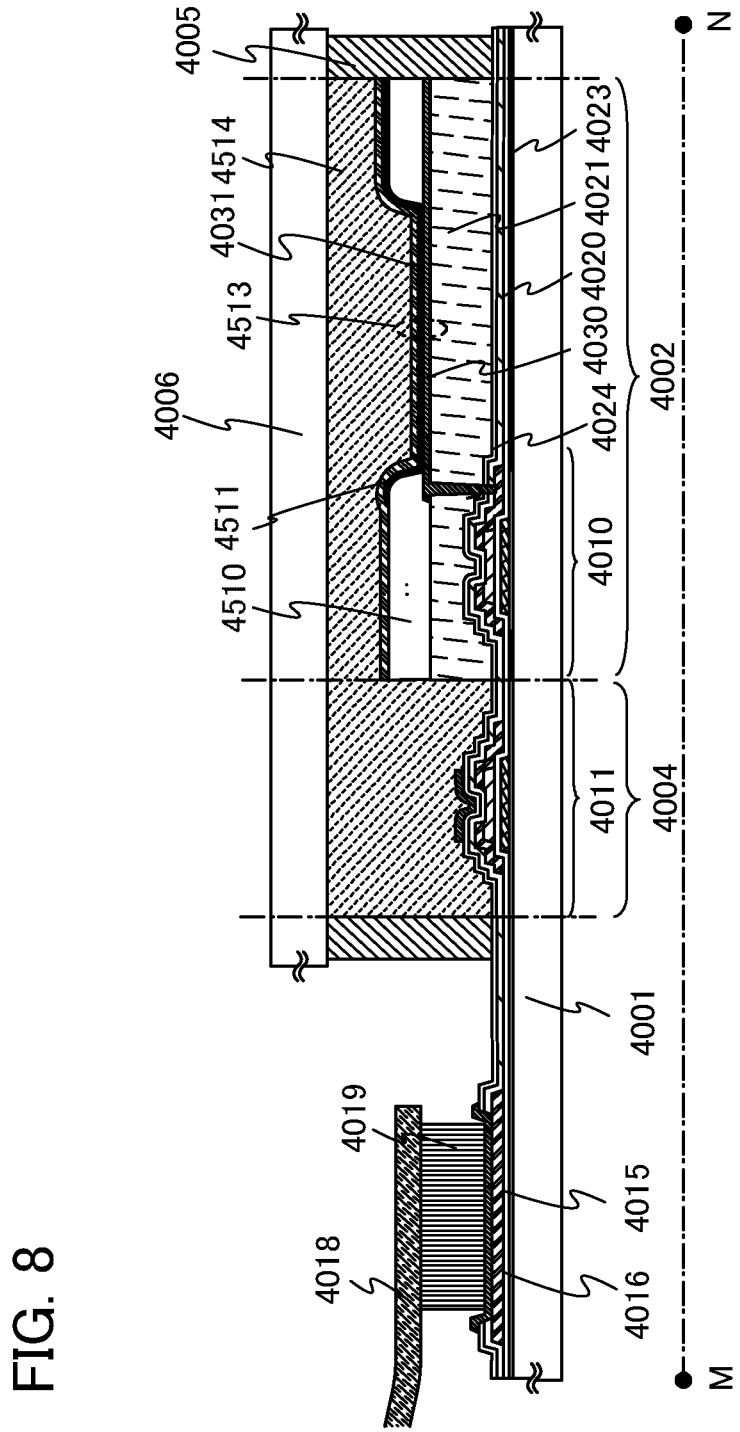
FIG. 8 is a diagram illustrating one embodiment of a semiconductor device.
Figure 9:
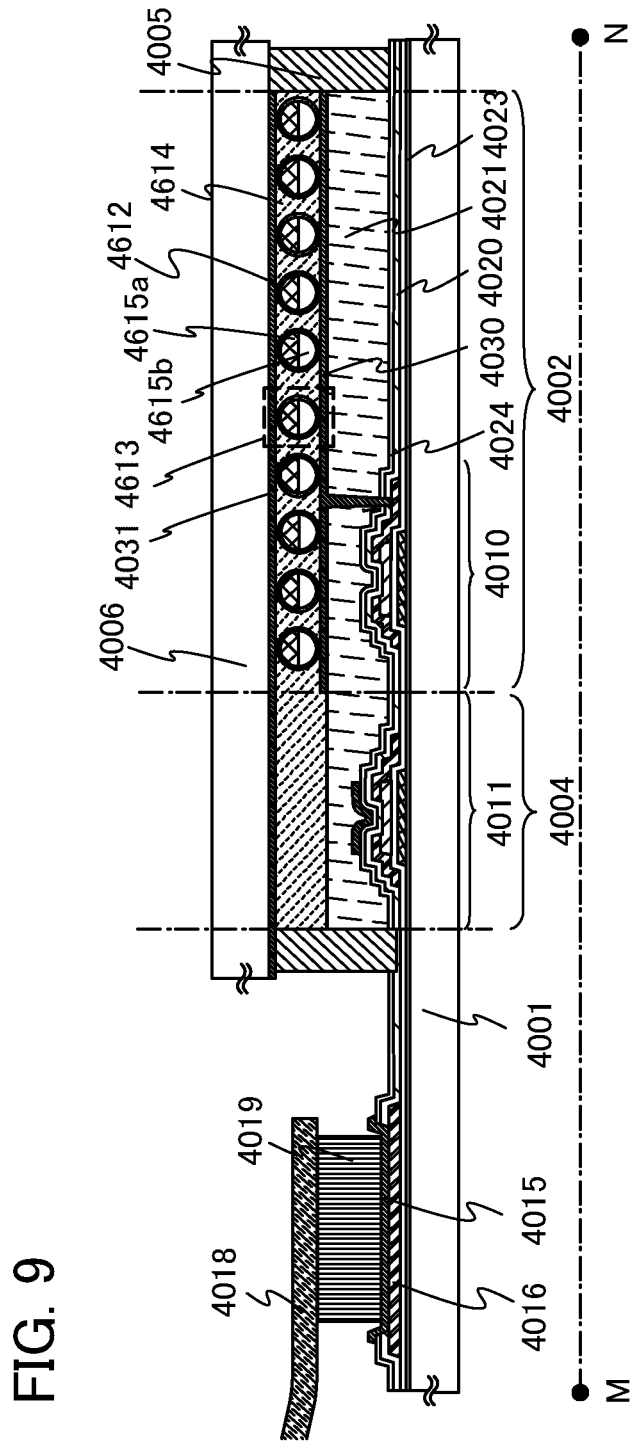
FIG. 9 is a diagram illustrating one embodiment of a semiconductor device.

Embodiments of the semiconductor device will be described with reference to FIG. 7, FIG. 8, and FIG. 9. FIG. 7, FIG. 8, and FIG. 9 correspond to cross-sectional views along line M-N in FIG. 6B.

As illustrated in FIG. 7, FIG. 8, and FIG. 9, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source electrode layers and drain electrode layers of transistors 4010 and 4011.

Each of the pixel portion 4002 and the scan line driver circuit 4004 which are provided over the first substrate 4001 includes a plurality of transistors. In FIG. 7, FIG. 8, and FIG. 9, the transistor 4010 included in the pixel portion 4002 and the transistor 4011 included in the scan line driver circuit 4004 are illustrated as examples. In FIG. 7, an insulating layer 4020 and an insulating layer 4024 are provided over the transistors 4010 and 4011. In FIG. 8 and FIG. 9, an insulating layer 4021 is further provided. Note that an insulating film 4023 is an insulating film serving as a base film.

In this embodiment, the transistor described in any of Embodiments 1 to 4 can be applied to the transistor 4010 and the transistor 4011.

In the transistor 4010 and the transistor 4011, an oxide semiconductor film is a highly purified oxide semiconductor film obtained by intentional removal of hydrogen or an impurity containing hydrogen such as water from an oxide semiconductor film through a rare gas ion implantation step and a heating step.

By the implantation of rare gas ions to the oxide semiconductor film, a bond between hydrogen and an element (e.g., a metal element) included in the oxide semiconductor is cut. Thus, hydrogen which is an impurity can be easily detached from the oxide semiconductor film by a heating step which is performed after the implantation of rare gas ions. Further, since a void (defect) is formed in the film by the implantation of rare gas ions, hydrogen after the bond is cut can be easily detached from the film via the void.

Further, a bond between a hydroxyl group and an element (e.g., a metal element) included in the oxide semiconductor is also cut by the implantation of rare gas ions to the oxide semiconductor film. Thus, in some cases, hydrogen is detached from the oxide semiconductor film as water as a result of bonding between hydrogen after the bond is cut and a hydroxyl group after the bond is cut.

Consequently, variation in the electric characteristics of the transistor 4010 and the transistor 4011 each including the highly purified oxide semiconductor film is suppressed and the transistor 4010 and the transistor 4011 are electrically stable. As described above, highly reliable semiconductor devices can be provided as the semiconductor devices of this embodiment illustrated in FIG. 7, FIG. 8, and FIG. 9.

In addition, in this embodiment, an example in which a conductive layer is provided over the insulating layer so as to overlap with a channel formation region of an oxide semiconductor film in the transistor 4011 for the driver circuit is described. The conductive layer is provided so as to overlap with the channel formation region of the oxide semiconductor film, whereby the amount of change in the threshold voltage of the transistor 4011 before and after a BT test can be further reduced. The potential of the conductive layer may be the same as or different from that of a gate electrode layer of the transistor 4011. The conductive layer can also function as a second gate electrode layer. The potential of the conductive layer may be GND, 0V, or in a floating state.

In addition, the conductive layer functions to block an external electric field, that is, to prevent an external electric field (particularly, to block static electricity) from effecting the inside (a circuit portion including a thin film transistor). A blocking function of the conductive layer can prevent the variation in the electric characteristics of the transistor due to the effect of an external electric field such as static electricity.

The transistor 4010 included in the pixel portion 4002 is electrically connected to a display element to form a display panel. A variety of display elements can be used as the display element as long as display can be performed.

An example of a liquid crystal display device using a liquid crystal element as a display element is illustrated in FIG. 7. In FIG. 7, a liquid crystal element 4013 which is a display element includes the first electrode layer 4030, a second electrode layer 4031, and a liquid crystal layer 4008. Note that insulating films 4032 and 4033 serving as alignment films are provided so that the liquid crystal layer 4008 is provided therebetween. The second electrode layer 4031 is provided on the second substrate 4006 side, and the first electrode layer 4030 and the second electrode layer 4031 are stacked, with the liquid crystal layer 4008 provided therebetween.

A columnar spacer denoted by reference numeral 4035 is obtained by selective etching of an insulating film and is provided to control the thickness (a cell gap) of the liquid crystal layer 4008. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used. A blue phase is one of liquid crystal phases, which appears just before a cholesteric phase changes into an isotropic phase while the temperature of a cholesteric liquid crystal is increased. Since the blue phase appears only in a narrow temperature range, a liquid crystal composition in which 5 wt % or more of a chiral material is mixed is used for the liquid crystal layer in order that the temperature range is improved. The liquid crystal composition which includes a liquid crystal exhibiting a blue phase and a chiral agent has a short response time of 1 msec or less, and has optical isotropy, which makes the alignment process unneeded and viewing angle dependence small. In addition, since an alignment film does not need to be provided and thus rubbing treatment is unnecessary, electrostatic discharge damage caused by rubbing treatment can be prevented, and defects and damage of the liquid crystal display device can be reduced in the manufacturing process. Accordingly, the productivity of the liquid crystal display device can be increased. A transistor including an oxide semiconductor film has a possibility that the electric characteristics of the transistor may vary significantly by the influence of static electricity and deviate from the designed range. Thus, it is more effective to use a liquid crystal material exhibiting a blue phase for a liquid crystal display device including the transistor that includes an oxide semiconductor film.

A value of the specific resistance of the liquid crystal material is higher than or equal to $1 \times 10^9$ $\Omega \cdot cm$, preferably higher than or equal to $1\times10^{11}$ Ω·cm, more preferably higher than or equal to $1\times10^{12}$ Ω·cm. The value of the specific resistance in this specification is measured at 20° C.

The size of a storage capacitor formed in the liquid crystal display device is set considering the leakage current of the transistor provided in the pixel portion or the like so that charges can be held for a predetermined period. The size of the storage capacitor may be set considering the off-state current of the transistor or the like. By using the transistor including the high-purity oxide semiconductor film, it is enough to provide a storage capacitor having a capacitance that is ⅓ or less, preferably ⅕ or less of a liquid crystal capacitance of each pixel.

In the transistor including the highly purified oxide semiconductor film used in this embodiment, the current in an off state (the off-state current) can be made small. Accordingly, an electric signal such as an image signal can be held for a longer period, and a writing interval can be set long in an on state. Thus, frequency of refresh operation can be reduced, which leads to an effect of suppressing power consumption.

In addition, the transistor including the highly purified oxide semiconductor film used in this embodiment can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed using a silicon wafer or the like is not additionally needed as a driver circuit, the number of components of the semiconductor device can be reduced. In addition, by using the transistor which can operate at high speed in the pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, an ASV mode, and the like can be given. This embodiment can also be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. It is possible to use a method called domain multiplication or multi-domain design, in which a pixel is divided into some regions (sub-pixels) and molecules are aligned in different directions in different regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method for the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Further, the sizes of display regions may be different between dots of respective color elements. The present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer in which particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side. A light-emitting element having any of these emission structures can be used.

FIG. 8 illustrates an example of a light-emitting device in which a light-emitting element is used as a display element. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 is formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that the light-emitting device be packaged (sealed) with a protective film (such as a laminate film or an ultraviolet curable resin film) or a cover material with high air-tightness and little degasification so as not to be exposed to the outside air, in this manner.

As the filler 4514, an ultraviolet curable resin or a thermosetting resin can be used, in addition to an inert gas such as nitrogen or argon, and polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have a variety of modes. An electrophoretic display device includes a plurality of microcapsules dispersed in a solvent or a solute, each microcapsule including first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material thereof.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 9 illustrates an active matrix electronic paper as one embodiment of the semiconductor device. The electronic paper in FIG. 9 is an example of a display device using a twisting ball display system. The twisting ball display system refers to a method in which spherical particles each colored in black and white are arranged between electrode layers used for a display element, and a potential difference is generated between the electrode layers to control orientation of the spherical particles, so that display is performed.

Between the first electrode layer 4030 connected to the transistor 4010 and the second electrode layer 4031 provided on the second substrate 4006, spherical particles 4613 each of which includes a black region 4615$a$, a white region 4615$b$, and a cavity 4612 which is filled with liquid around the black region 4615$a$ and the white region 4615$b$, are provided. A space around the spherical particles 4613 is filled with a filler 4614 such as a resin. The second electrode layer 4031 corresponds to a common electrode (counter electrode). The second electrode layer 4031 is electrically connected to a common potential line.

Note that in FIG. 7, FIG. 8, and FIG. 9, a flexible substrate as well as a glass substrate can be used as the first substrate 4001 and the second substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. A sheet with a structure in which an aluminum foil is provided between PVF films or polyester films can also be used.

The insulating layer 4020 and the insulating layer 4024 each functions as a protective film of the transistors.

Further, when a film (e.g., a silicon oxide film or a silicon oxynitride film) containing much oxygen is used as the insulating layer 4020, the insulating layer 4020 can be used as a supply source of oxygen for the oxide semiconductor film.

As each of the insulating layer 4020 and the insulating layer 4024, a single layer or a stack using one or more of inorganic insulating films typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film can be used.

Note that the insulating layer 4021 serving as a planarizing insulating film can be formed using a heat-resistant organic material such as acrylic, polyimide, benzocyclobutene, polyamide, or epoxy. Other than such organic materials, it is possible to use a low-dielectric constant material (low-k material), a siloxane based resin, phosphosilicate glass (PSG), borophosphosilicate glass (BPSG), or the like. The insulating layer may be formed by stacking a plurality of insulating films formed using these materials.

Methods for forming the insulating layer 4020, the insulating layer 4024, and the insulating layer 4021 is not particularly limited, and a sputtering method, an SOG method, a spin coating method, a dipping method, a spray coating method, a droplet discharge method (e.g., an inkjet method), a screen printing method, an offset printing method, a doctor knife, a roll coater, a curtain coater, a knife coater, or the like can be used depending on the material.

The display device displays an image by transmitting light from a light source or a display element. Thus, the substrate and the thin films such as the insulating film and the conductive film provided for the pixel portion where light is transmitted have light-transmitting properties with respect to light in the visible-light wavelength range.

The first electrode layer (also called a pixel electrode layer or the like) and the second electrode layer (also called a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

The first electrode layer 4030 and the second electrode layer 4031 can be formed of one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

A conductive composition containing a conductive high molecule (also referred to as a conductive polymer) can be used for the first electrode layer 4030 and the second electrode layer 4031. As the conductive high molecule, a so-called π-electron conjugated conductive polymer can be used. For example, polyaniline or a derivative thereof; polypyrrole or a derivative thereof; polythiophene or a derivative thereof; a copolymer of two or more of aniline, pyrrole, and thiophene or a derivative thereof; and the like can be given.

Since the transistor is easily broken owing to static electricity or the like, a protective circuit for protecting the driver circuit is preferably provided. The protective circuit is preferably formed using a nonlinear element.

By using any of the transistors described in any of Embodiments 1 to 4 as described above, a semiconductor device having a variety of functions can be provided.

(Embodiment 6)

A semiconductor device having an image sensor function for reading data of an object can be formed with the use of the transistor whose example is described in any of Embodiments 1 to 4.

Figure 10A:
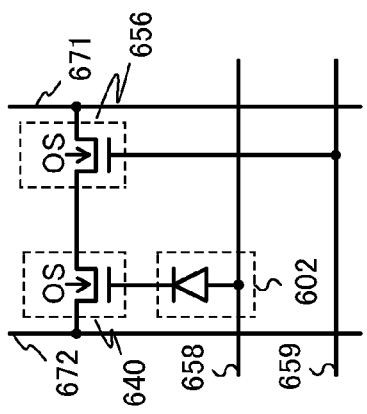
FIGS. 10A and 10B are diagrams illustrating one embodiment of a semiconductor device.

An example of the semiconductor device having an image sensor function is illustrated in FIG. 10A. FIG. 10A is an equivalent circuit of a photo sensor and FIG. 10B is a cross-sectional view illustrating part of the photo sensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photo sensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photo sensor output signal line 671.

Note that in circuit diagrams in this specification, a transistor including an oxide semiconductor film is denoted by a symbol "OS" so that it can be identified as a transistor including an oxide semiconductor film. The transistor 640 and the transistor 656 in FIG. 10A are transistors each including an oxide semiconductor film.

Figure 10B:
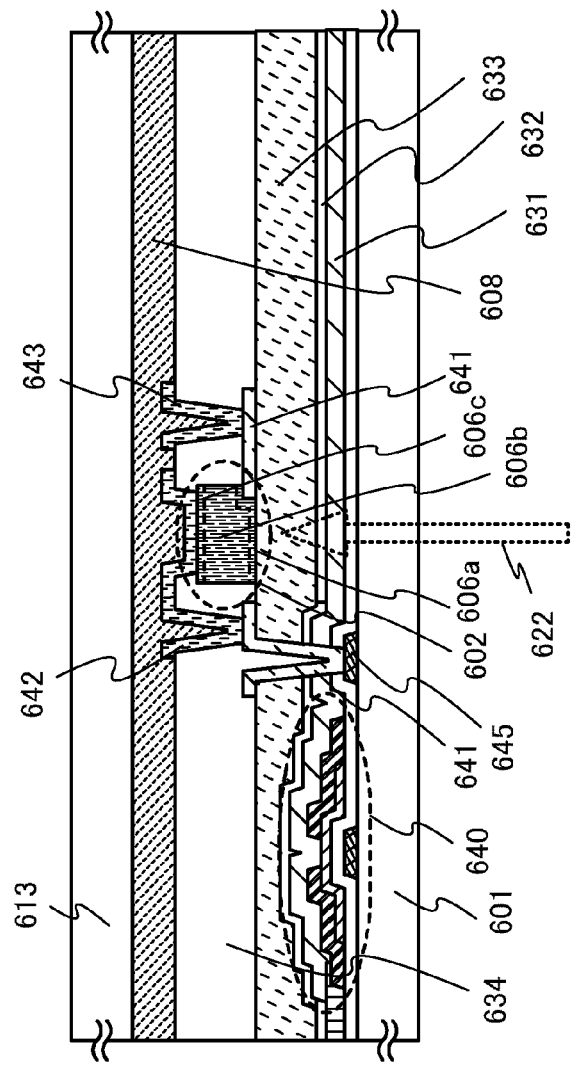

FIG. 10B is a cross-sectional view of the photodiode 602 and the transistor 640 in the photo sensor. The photodiode 602 functioning as a sensor and the transistor 640 are provided over a substrate 601 (a TFT substrate) having an insulating surface. A substrate 613 is provided over the photodiode 602 and the transistor 640 using an adhesive layer 608.

An insulating layer 631, a protective insulating layer 632, an interlayer insulating layer 633, and an interlayer insulating layer 634 are provided over the transistor 640. The photodiode 602 is provided over the interlayer insulating layer 633. In the photodiode 602, a first semiconductor layer 606a, a second semiconductor layer 606b, and a third semiconductor layer 606c are stacked in that order over the interlayer insulating layer 633 between an electrode layer 641 formed over the interlayer insulating layer 633 and an electrode layer 642 formed over the interlayer insulating layer 634.

The electrode layer 641 is electrically connected to a conductive layer 643 which is formed in the interlayer insulating layer 634, and the electrode layer 642 is electrically connected to a gate electrode layer 645 through the electrode layer 641. The gate electrode layer 645 is electrically connected to a gate electrode layer of the transistor 640, and the photodiode 602 is electrically connected to the transistor 640.

Here, a pin photodiode in which a semiconductor layer having p-type conductivity as the first semiconductor layer 606a, a high-resistance semiconductor layer (i-type semiconductor layer) as the second semiconductor layer 606b, and a semiconductor layer having n-type conductivity as the third semiconductor layer 606c are stacked is illustrated as an example.

The first semiconductor layer 606a is a p-type semiconductor layer and can be formed using an amorphous silicon film containing an impurity element imparting p-type conductivity. The first semiconductor layer 606a is formed by a plasma CVD method with the use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with the use of a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor deposition method, a sputtering method, or the like may be used. The first semiconductor layer 606a is preferably formed to have a thickness greater than or equal to 10 nm and less than or equal to 50 nm.

The second semiconductor layer 606b is an i-type semiconductor layer (intrinsic semiconductor layer) and is formed using an amorphous silicon film. As for formation of the second semiconductor layer 606b, an amorphous silicon film is formed with the use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 606b may be formed by an LPCVD method, a vapor deposition method, a sputtering method, or the like. The second semiconductor layer 606b is preferably formed to have a thickness greater than or equal to 200 nm and less than or equal to 1000 nm.

The third semiconductor layer 606c is an n-type semiconductor layer and is formed using an amorphous silicon film containing an impurity element imparting n-type conductivity. The third semiconductor layer 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with the use of a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor deposition method, a sputtering method, or the like may be used. The third semiconductor layer 606c is preferably formed to have a thickness greater than or equal to 20 nm and less than or equal to 200 nm.

The first semiconductor layer 606a, the second semiconductor layer 606b, and the third semiconductor layer 606c are not necessarily formed using an amorphous semiconductor, and they may be formed using a polycrystalline semiconductor or a microcrystalline semiconductor (a semi-amorphous semiconductor: SAS).

Considering Gibbs free energy, a microcrystalline semiconductor is in a metastable state which is intermediate between an amorphous state and a single crystal state. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than $520 \text{ cm}^{-1}$, which represents a peak of the Raman spectrum of single crystal silicon. That is, the peak of the Raman spectrum of the microcrystalline silicon exists between $520 \text{ cm}^{-1}$ which represents single crystal silicon and $480 \text{ cm}^{-1}$ which represents amorphous silicon. The semiconductor contains hydrogen or halogen of at least 1 at. % to terminate a dangling bond. Moreover, microcrystalline silicon contains a rare gas element such as helium, argon, krypton, or neon to further promote lattice distortion, so that stability can be increased and a favorable microcrystalline semiconductor film can be obtained.

The microcrystalline semiconductor film can be formed by a high-frequency plasma CVD method with a frequency of several tens of megahertz to several hundreds of megahertz or using a microwave plasma CVD apparatus with a frequency of 1 GHz or more. Typically, the microcrystalline semiconductor film can be formed using a dilution of silicon hydride such as $SiH_4$, $Si_2H_6$, $SiH_2Cl_2$, $SiHCl_3$, $SiCl_4$, or $SiF_4$ with hydrogen. Further, with a dilution with one or plural kinds of rare gas elements selected from helium, argon, krypton, and neon in addition to silicon hydride and hydrogen, the microcrystalline semiconductor film can be formed. In that case, the flow ratio of hydrogen to silicon hydride is from 5:1 to 200:1, preferably from 50:1 to 150:1, more preferably 100:1.

Further, a carbide gas such as $CH_4$ or $C_2H_6$, a germanium gas such as $GeH_4$ or $GeF_4$, $F_2$, or the like may be mixed into the gas containing silicon.

In addition, since the mobility of holes generated by the photoelectric effect is lower than that of electrons, the pin photodiode has better characteristics when a surface on the p-type semiconductor layer side is used as a light-receiving surface. Here, an example in which light received by the photodiode 602 from a surface of the substrate 601, over which the pin photodiode is formed, is converted into electric signals is described. Further, light from the semiconductor layer having a conductivity type opposite to that of the semiconductor layer on the light-receiving surface is disturbance light; thus, the electrode layer is preferably formed using a light-blocking conductive film. Note that a surface of the n-type semiconductor layer side can alternatively be used as the light-receiving surface.

The insulating layer 631, the protective insulating layer 632, the interlayer insulating layer 633, and the interlayer insulating layer 634 can be formed using an insulating material, and a sputtering method, an SOG method, a spin coating method, a dipping method, a spray coating method, a droplet discharge method (e.g., an inkjet method), a screen printing method, an offset printing method, a doctor knife, a roll coater, a curtain coater, a knife coater, or the like can be used depending on the material.

As the insulating layer 631, a single layer or a stack using one or more of oxide insulating layers such as a silicon oxide layer, a silicon oxynitride layer, an aluminum oxide layer, and an aluminum oxynitride layer can be used.

As the protective insulating layer 632, a single layer or a stack using one or more of nitride insulating layers such as a silicon nitride layer, a silicon nitride oxide layer, an aluminum nitride layer, and an aluminum nitride oxide layer can be used. High-density plasma CVD using microwaves (2.45 GHz) is preferably employed because a dense insulating layer having high withstand voltage and high quality can be formed.

For reduction of the surface roughness, an insulating layer functioning as a planarizing insulating film is preferably used as the interlayer insulating layers 633 and 634. The interlayer insulating layers 633 and 634 can be formed using, for example, an organic insulating material having heat resistance such as polyimide, an acrylic resin, a benzocyclobutene resin, polyamide, or an epoxy resin. Other than such organic insulating materials, a single-layer or stacked-layer structure using a low-dielectric constant material (low-k material), a siloxane based resin, phosphosilicate glass (PSG), borophosphosilicate glass (BPSG), or the like can be used.

When the light that enters the photodiode 602 is detected, data on an object to be detected can be read. Note that a light source such as a backlight can be used at the time of reading data on an object to be detected.

Any of the transistors described in Embodiments 1 to 4 can be used as the transistor 640.

In the transistor 640, an oxide semiconductor film is a highly purified oxide semiconductor film obtained by intentional removal of hydrogen or an impurity containing hydrogen such as water from an oxide semiconductor film through a rare gas ion implantation step and a heating step.

By the implantation of rare gas ions to the oxide semiconductor film, a bond between hydrogen and an element (e.g., a metal element) included in the oxide semiconductor is cut. Thus, hydrogen which is an impurity can be easily detached from the oxide semiconductor film by a heating step which is performed after the implantation of rare gas ions. Further, since a void (defect) is formed in the film by the implantation of rare gas ions, hydrogen after the bond is cut can be easily detached from the film via the void.

Further, a bond between a hydroxyl group and an element (e.g., a metal element) included in the oxide semiconductor is also cut by the implantation of rare gas ions to the oxide semiconductor film. Thus, in some cases, hydrogen is detached from the oxide semiconductor film as water as a result of bonding between hydrogen after the bond is cut and a hydroxyl group after the bond is cut.

Consequently, variation in the electric characteristics of the transistor 640 including the highly purified oxide semiconductor film is suppressed and the transistor 640 is electrically stable. As described above, a highly reliable semiconductor device can be provided as the semiconductor device of this embodiment.

This embodiment can be implemented in appropriate combination with the structures described in other embodiments.

(Embodiment 7)

The transistor whose example is described in any of Embodiments 1 to 4 can be preferably used in a semiconductor device including an integrated circuit in which a plurality of transistors is stacked. In this embodiment, as an example of the semiconductor device, a memory medium (memory element) will be described.

In this embodiment, a semiconductor device including a transistor 140 that is a first transistor formed using a single crystal semiconductor substrate, and a transistor 162 that is a second transistor formed using a semiconductor film above the transistor 140 with an insulating layer provided therebetween is manufactured. The transistor whose example is described in any of Embodiments 1 to 4 can be preferably used as the transistor 162.

Semiconductor materials and structures of the transistor 140 and the transistor 162, which are stacked, may be the same or different from each other. In this embodiment, an example in which a transistor with a suitable material and structure for a circuit of a memory medium (memory element) is used as each of the transistor 140 and the transistor 162 is described.

Figure 5A:
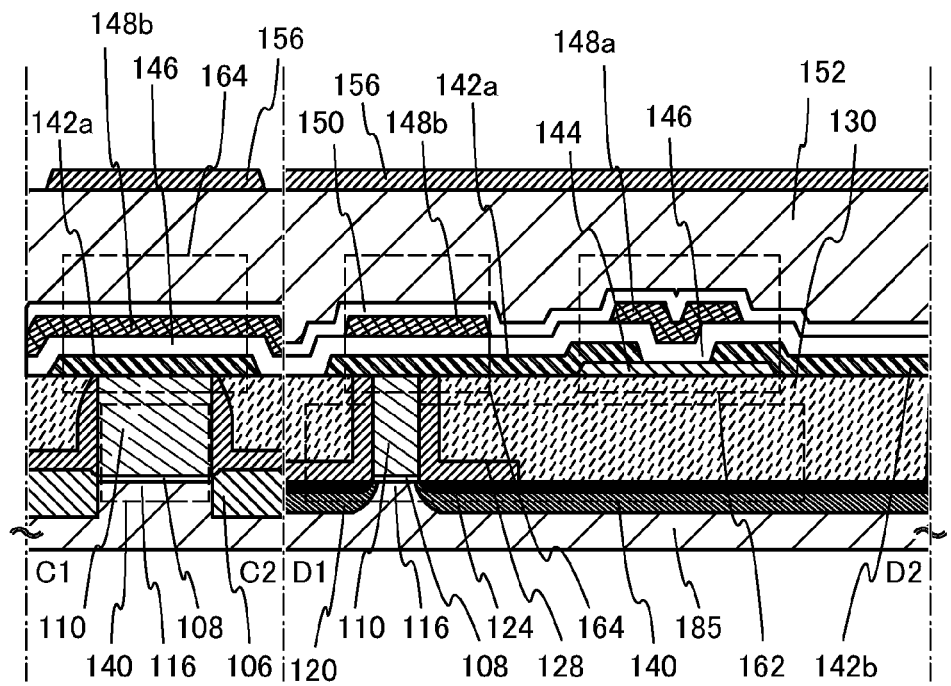
FIGS. 5A to 5C are diagrams illustrating one embodiment of a semiconductor device.
Figure 5B:
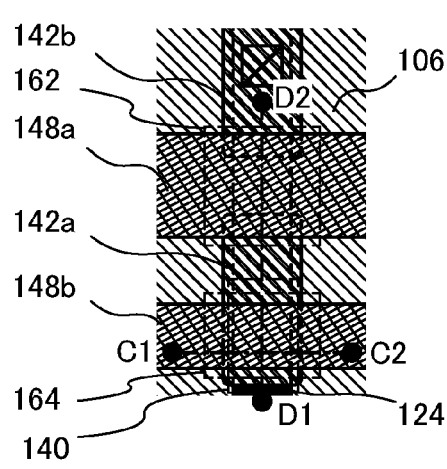
Figure 5C:
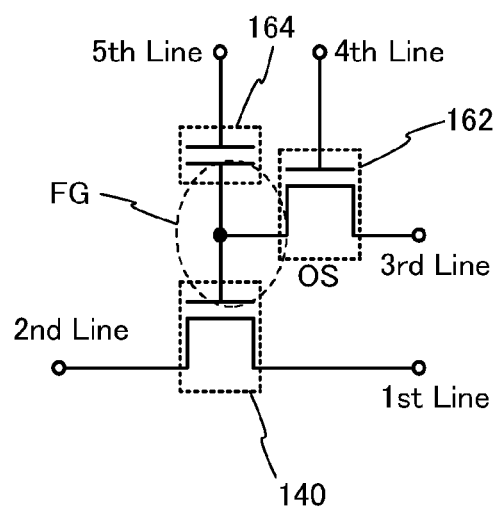

FIGS. 5A to 5C illustrate an example of a structure of the semiconductor device. FIG. 5A illustrates a cross section of the semiconductor device, and FIG. 5B illustrates a plan view of the semiconductor device. Here, FIG. 5A illustrates a cross section taken along line C1-C2 and line D1-D2 in FIG. 5B. In addition, FIG. 5C illustrates an example of a circuit diagram in the case of using the semiconductor device as a memory element. The semiconductor device illustrated in FIGS. 5A and 5B includes the transistor 140 formed using a first semiconductor material in a lower portion, and the transistor 162 formed using a second semiconductor material in an upper portion. In this embodiment, the first semiconductor material is a semiconductor material except an oxide semiconductor, and the second semiconductor material is an oxide semiconductor. As the semiconductor material except an oxide semiconductor, for example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at high speed easily. On the other hand, a transistor including an oxide semiconductor can hold charge for a long time owing to its characteristics.

A manufacturing method of the semiconductor device in FIGS. 5A to 5C will be described with reference to FIGS. 5A and 5B.

The transistor 140 includes a channel formation region 116 provided in a substrate 185 including a semiconductor material (such as silicon), impurity regions 120 provided so that the channel formation region 116 is placed therebetween, metal compound regions 124 in contact with the impurity regions 120, a gate insulating layer 108 provided over the channel formation region 116, and a gate electrode 110 provided over the gate insulating layer 108.

As the substrate 185 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Note that although the term "SOI substrate" generally means a substrate in which a silicon semiconductor layer is provided on an insulating surface, the term "SOI substrate" in this specification and the like also includes a substrate in which a semiconductor layer including a material which is not silicon is provided on an insulating surface. That is, a semiconductor layer included in the "SOI substrate" is not limited to a silicon semiconductor layer. Further, the SOI substrate can be a substrate having a structure in which a semiconductor layer is provided over an insulating substrate such as a glass substrate, with an insulating layer provided therebetween.

An SOI substrate can be formed by a method in which a mirror-polished wafer is heated at a high temperature after oxygen ions are implanted so that an oxidized layer is formed at a predetermined depth from a surface of the wafer and defects generated in a surface layer are eliminated. Alternatively, an SOI substrate can be formed by a method in which a semiconductor substrate is separated with the use of the growth of microvoids by heat treatment, where the microvoids are formed by hydrogen ion irradiation. Further alternatively, an SOI substrate can be formed by a method in which a single crystal semiconductor layer is formed on an insulating surface by crystal growth.

An SOI substrate formed in the following manner can also be preferably used, for example: ions are added to a single crystal semiconductor substrate from one surface to form a fragile layer at a predetermined depth from the one surface of the single crystal semiconductor substrate; an insulating layer is formed either over the one surface of the single crystal semiconductor substrate or over an element substrate; a crack is formed in the fragile layer in a state where the insulating layer is provided between the single crystal semiconductor substrate and the element substrate; and heat treatment for separating the single crystal semiconductor substrate at the fragile layer is performed to form a single crystal semiconductor layer as a semiconductor layer over the element substrate from the single crystal semiconductor substrate.

The substrate 185 is provided with an element isolation insulating layer 106 which surrounds the transistor 140. Note that it is preferable that the transistor 140 do not have a sidewall insulating layer as illustrated in FIG. 5A to obtain high integration. On the other hand, when the characteristics of the transistor 140 have priority, the sidewall insulating layer may be provided on a side surface of the gate electrode 110, and the impurity regions 120 including regions with different impurity concentrations may be provided.

The transistor 140 formed using a single crystal semiconductor substrate can operate at high speed. Thus, when the transistor is used as a reading transistor, data can be read at a high speed.

Two insulating layers are formed so as to cover the transistor 140. As treatment prior to the formation of the transistor 162 and a capacitor 164, the two insulating layers are subjected to CMP treatment so that an insulating layer 128 and an insulating layer 130 which are planarized are formed, and at the same time, an upper surface of the gate electrode 110 is exposed.

As each of the insulating layer 128 and the insulating layer 130, an inorganic insulating film typical examples of which are a silicon oxide film, a silicon oxynitride film, an aluminum oxide film, an aluminum oxynitride film, a silicon nitride film, an aluminum nitride film, a silicon nitride oxide film, and an aluminum nitride oxide film can be used. The insulating layer 128 and the insulating layer 130 can be formed by a plasma CVD method, a sputtering method, or the like.

Alternatively, an organic material such as polyimide, an acrylic resin, or a benzocyclobutene resin can be used. Other than such organic materials, it is also possible to use a low-dielectric constant material (low-k material) or the like. In the case of using an organic material, a wet process such as a spin coating method or a printing method may be used to form the insulating layer 128 and the insulating layer 130.

In this embodiment, a silicon oxynitride film with a thickness of 50 nm is formed by a sputtering method as the insulating layer 128, and a silicon oxide film with a thickness of 550 nm is formed by a sputtering method as the insulating layer 130.

A semiconductor film is formed over the insulating layer 130 which is sufficiently planarized by CMP treatment. In this embodiment, as the semiconductor film, an oxide semiconductor film is formed by a sputtering method with the use of an In—Ga—Zn—O-based oxide target.

Then, as described in Embodiment 1, a heating step is performed on the oxide semiconductor film to which rare gas ions are implanted so that an impurity such as hydrogen or water is released from the oxide semiconductor film to the outside of the film. The heating step may be performed on the oxide semiconductor film, to which rare gas ions are implanted, at a temperature higher than or equal to 300° C. and lower than or equal to 700° C. or lower than the strain point of a substrate. The heating step may be performed under reduced pressure, in a nitrogen atmosphere, or in a rare gas atmosphere. For example, the heating step may be performed in such a manner that an object to be heated is introduced into an electric furnace in which a resistance heating element or the like is used and heated at 450° C. for one hour in a nitrogen atmosphere. The oxide semiconductor film is not exposed to the air during the heating step so that entry of water and hydrogen can be prevented. When rare gas ions are implanted to the oxide semiconductor film before the heating step, release of hydrogen and moisture from the oxide semiconductor film to the outside of the film is promoted during the heating step.

An impurity such as hydrogen or water which leads to deterioration of reliability of the transistor is reduced and in the above manner and then oxygen is sufficiently supplied, whereby an i-type (intrinsic) or substantially i-type oxide semiconductor film is formed, thus, a transistor having extremely excellent characteristics can be fabricated.

Next, the oxide semiconductor film is selectively etched and a semiconductor layer 144 is formed.

Subsequently, a conductive layer is formed over the gate electrode 110, the insulating layer 128, the insulating layer 130, and the like, and selectively etched, so that a source or drain electrode 142a and a source or drain electrode 142b are formed.

The conductive layer can be formed by a PVD method such as a sputtering method, or a CVD method such as a plasma CVD method. Further, as the material of the conductive layer, an element selected from Al, Cr, Cu, Ta, Ti, Mo, and W, an alloy containing the above element as its component, or the like can be used. Any of Mn, Mg, Zr, Be, Nd, and Sc, or a material containing any of these in combination may be used.

The conductive layer can have a single-layer structure or a stacked-layer structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has a single-layer structure of a titanium film or a titanium nitride film, there is an advantage that the conductive layer is easily processed into the source or drain electrode 142a and the source or drain electrode 142b having tapered shapes.

A channel length (L) of the upper transistor 162 is determined by a distance between a lower edge portion of the source or drain electrode 142a and a lower edge portion of the source or drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers.

Next, a gate insulating layer 146 in contact with the semiconductor layer 144 is formed. The gate insulating layer 146 can be formed to have a single-layer structure or a stacked-layer structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, and a gallium oxide layer by a plasma CVD method, a sputtering method, or the like.

Next, over the gate insulating layer 146, a gate electrode 148a is formed in a region overlapping with the semiconductor layer 144 and an electrode 148b is formed in a region overlapping with the source or drain electrode 142a.

After the gate insulating layer 146 is formed, a heating step (second heating step) is preferably performed in an inert gas atmosphere or an oxygen atmosphere. The temperature of the heating step is higher than or equal to 200° C. and lower than or equal to 450° C., preferably higher than or equal to 250° C. and lower than or equal to 350° C. For example, the heating step may be performed at 250° C. for one hour in a nitrogen atmosphere. The heating step can reduce variation in the electric characteristics of the transistor. Further, as a film containing oxygen, the gate insulating layer 146 can supply oxygen to the semiconductor layer 144 to fill oxygen defects in the semiconductor layer 144, so that an i-type (intrinsic) or substantially i-type oxide semiconductor film can be formed.

As described above, the heating step is performed on the oxide semiconductor film to which rare gas ions are implanted, whereby the semiconductor layer 144 can be highly purified so as to contain impurities which are not main components as few as possible.

The gate electrode 148a and the electrode 148b can be formed in such a manner that a conductive layer is formed over the gate insulating layer 146 and then etched selectively.

Then, an insulating layer 150 and an insulating layer 152 are formed over the gate insulating layer 146, the gate electrode 148a, and the electrode 148b. The insulating layer 150 and the insulating layer 152 can be formed by a sputtering method, a CVD method, or the like. The insulating layer 150 and the insulating layer 152 can be formed using a material including an inorganic insulating material such as silicon oxide, silicon oxynitride, silicon nitride, hafnium oxide, or aluminum oxide.

Next, an opening that reaches the source or drain electrode 142b is formed in the gate insulating layer 146, the insulating layer 150, and the insulating layer 152. The opening is formed by selective etching with the use of a mask or the like.

After that, a wiring 156 is formed in the opening to be in contact with the source or drain electrode 142b. Note that a connection point of the source or drain electrode 142b and the wiring 156 is not illustrated in FIGS. 5A and 5B.

The wiring 156 is formed in such a manner that a conductive layer is formed by a PVD method such as a sputtering method or a CVD method such as a plasma CVD method and then the conductive layer is etched. Further, as the material of the conductive layer, an element selected from Al, Cr, Cu, Ta, Ti, Mo, and W, an alloy containing the above element as its component, or the like can be used. Any of Mn, Mg, Zr, Be, Nd, and Sc, or a material containing any of these in combination may be used. The details are the similar to those of the source or drain electrode 142a and the like.

Through the above process, the transistor 162 including the highly purified semiconductor layer 144 and the capacitor 164 are completed. The capacitor 164 includes the source or drain electrode 142a, the semiconductor layer 144, the gate insulating layer 146, and the electrode 148b.

Note that in the capacitor 164 illustrated in FIGS. 5A to 5C, insulation between the source or drain electrode 142a and the electrode 148b can be sufficiently secured by stacking the semiconductor layer 144 and the gate insulating layer 146. It is needless to say that the capacitor 164 without the semiconductor layer 144 may be employed in order to secure sufficient capacitance. Alternatively, an insulating layer may be included in the capacitor 164. Further alternatively, the capacitor 164 may be omitted in the case where a capacitor is not needed.

FIG. 5C illustrates an example of a diagram of a circuit using the semiconductor device as a memory element. In FIG. 5C, one of a source electrode and drain electrode of the transistor 162, one electrode of the capacitor 164, and a gate electrode of the transistor 140 are electrically connected to one another. A first wiring (1st line, also referred to as a source line) is electrically connected to a source electrode of the transistor 140. A second wiring (2nd line, also referred to as a bit line) is electrically connected to a drain electrode of the transistor 140. A third wiring (3rd Line, also referred to as a first signal line) is electrically connected to the other of the source electrode and the drain electrode of the transistor 162. A fourth wiring (4th Line, also referred to as a second signal line) is electrically connected to a gate electrode of the transistor 162. A fifth wiring (5th line, also referred to as a word line) is electrically connected to the other electrode of the capacitor 164.

The transistor 162 including an oxide semiconductor has extremely low off-state current; therefore, when the transistor 162 is in an off state, a potential of a node (hereinafter, a node FG) where the one of the source electrode and drain electrode of the transistor 162, the one electrode of the capacitor 164, and the gate electrode of the transistor 140 are electrically connected to one another can be held for an extremely long time. The capacitor 164 facilitates holding of charge given to the node FG and reading of the held data.

When data is stored in the memory cell (in writing of data), first, the potential of the fourth wiring is set to a potential at which the transistor 162 is turned on, whereby the transistor 162 is turned on. Thus, the potential of the third wiring is applied to the node FG and a predetermined amount of charge is accumulated in the node FG Here, charge for applying either of two different potential levels (hereinafter referred to as a low-level charge and a high-level charge) is given to the node FG. After that, the potential of the fourth wiring is set to a potential at which the transistor 162 is turned off, whereby the transistor 162 is turned off. This makes the node FG floating and the predetermined amount of charge is held in the node FG The predetermined amount of charge is thus accumulated and held in the node FG, whereby the memory cell can store data.

Since the off-state current of the transistor 162 is extremely small, the charge applied to the node FG is held for a long period. This can remove the need of refresh operation or drastically reduce the frequency of the refresh operation, which leads to a sufficient reduction in power consumption. Moreover, stored data can be stored for a long time even when power is not supplied.

When stored data is read out (in reading of data), while a predetermined potential (a fixed potential) is applied to the first wiring, an appropriate potential (a read-out potential) is applied to the fifth wiring, whereby the transistor 140 changes its state depending on the amount of charge held in the node FG This is because in general, when the transistor 140 is an n-channel transistor, an apparent threshold value $V_{th\_H}$ of the transistor 140 in the case where a high-level charge is held in the node FG is lower than an apparent threshold value $V_{th\_L}$, of the transistor 140 in the case where a low-level charge is held in the node FG. Here, an apparent threshold voltage refers to the potential of the fifth wiring, which is needed to turn on the transistor 140. Thus, by setting the potential of the fifth wiring to a potential $V_0$ which is between $V_{th\_H}$ and $V_{th\_L}$, charge held in the node FG can be determined For example, in the case where a high-level charge is given in writing, when the potential of the fifth wiring is set to $V_0 (> V_{th\_H})$, the transistor 140 is turned on. In the case where a low-level charge is given in writing, even when the potential of the fifth wiring is set to $V_0 (< V_{th\_L})$, the transistor 140 remains in an off state. In such a manner, by controlling the potential of the fifth wiring and determining whether the transistor 140 is in an on state or off state (reading out the potential of the second wiring), stored data can be read out.

Further, in order to rewrite stored data, a new potential is applied to the node FG that is holding the predetermined amount of charge given in the above writing, so that the charge of the new data is held in the node FG. Specifically, the potential of the fourth wiring is set to a potential at which the transistor 162 is turned on, whereby the transistor 162 is turned on. Thus, the potential of the third wiring (a potential of new data) is applied to the node FG, and the predetermined amount of charge is accumulated in the node FG. After that, the potential of the fourth wiring is set to a potential at which the transistor 162 is turned off, whereby the transistor 162 is turned off Thus, charge of the new data is held in the node FG In other words, while the predetermined amount of charge given in the first writing is held in the node FG, the same operation (a second writing) as in the first writing is performed, whereby the stored data can be overwritten.

The off-state current of the transistor 162 described in this embodiment can be sufficiently reduced by using an intrinsic oxide semiconductor film, which is obtained by sufficiently supplying oxygen to the highly purified oxide semiconductor film, as the semiconductor layer 144. With the use of such a transistor, a semiconductor device in which stored data can be stored for an extremely long time can be obtained.

The structures, methods, and the like described in this embodiment can be combined as appropriate with any of the structures, methods, and the like and described in the other embodiments.

(Embodiment 8)

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in any of the above embodiments will be described.

Figure 11A:
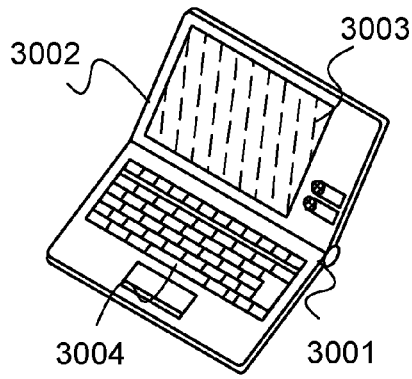
FIGS. 11A to 11F are diagrams each illustrating an electronic device.

FIG. 11A illustrates a laptop personal computer, which includes a main body 3001, a housing 3002, a display portion 3003, a keyboard 3004, and the like. The semiconductor device described in any of Embodiments 1 to 7 is used for the display portion 3003, whereby a highly reliable laptop personal computer can be provided.

Figure 11B:
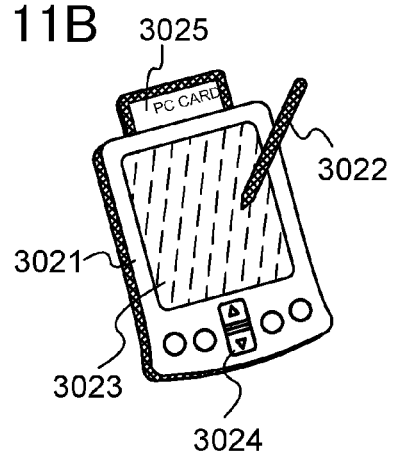

FIG. 11B illustrates a personal digital assistant (PDA), which includes a main body 3021 provided with a display portion 3023, an external interface 3025, operation buttons 3024, and the like. A stylus 3022 is provided as an accessory for operation. The semiconductor device described in any of Embodiments 1 to 7 is used for the display portion 3023, whereby a highly reliable personal digital assistant (PDA) can be provided.

Figure 11C:
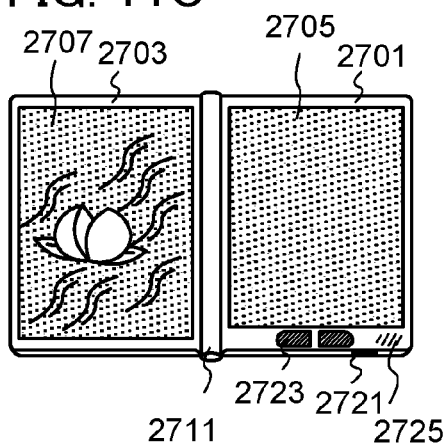

FIG. 11C illustrates an example of an e-book reader. For example, the e-book reader includes two housings, a housing 2701 and a housing 2703. The housing 2701 and the housing 2703 are combined with a hinge 2711 so that the e-book reader can be opened and closed with the hinge 2711 as an axis. With such a structure, the e-book reader can operate like a paper book.

A display portion 2705 and a display portion 2707 are incorporated in the housing 2701 and the housing 2703, respectively. The display portion 2705 and the display portion 2707 may display one image or different images. In the structure where different images are displayed in the above display portions, for example, the right display portion (the display portion 2705 in FIG. 11C) can display text and the left display portion (the display portion 2707 in FIG. 11C) can display images. The semiconductor device described in any of Embodiments 1 to 7 is used for the display portion 2705 and the display portion 2707, whereby a highly reliable e-book reader can be provided. In the case of using a transflective or reflective liquid crystal display device as the display portion 2705, the e-book reader may be used in a comparatively bright environment; therefore, a solar cell may be provided so that power generation by the solar cell and charge by a battery can be performed. When a lithium ion battery is used as the battery, there are advantages of downsizing and the like.

FIG. 11C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader may have a function of an electronic dictionary.

The e-book reader may transmit and receive data wirelessly. Through wireless communication, desired book data or the like can be purchased and downloaded from an electronic book server.

Figure 11D:
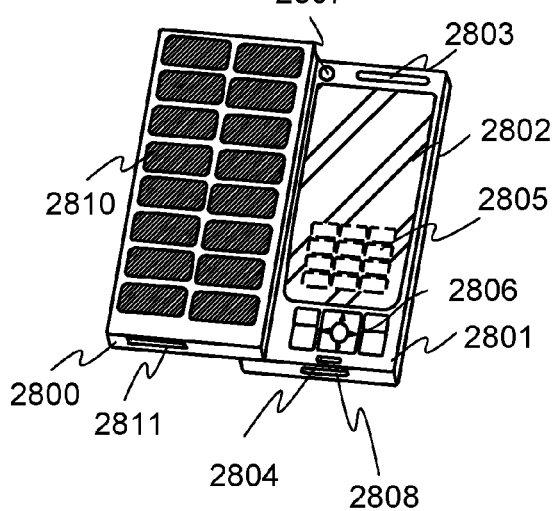

FIG. 11D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. An antenna is incorporated in the housing 2801. The semiconductor device described in any of Embodiments 1 to 7 is used for the display panel 2802, whereby a highly reliable mobile phone can be provided.

Further, the display panel 2802 is provided with a touch panel. A plurality of operation keys 2805 which is displayed as images is illustrated by dashed lines in FIG. 11D. Note that a boosting circuit by which a voltage output from the solar cell 2810 is increased to be sufficiently high for each circuit is also provided.

The display direction of the display panel 2802 is changed as appropriate depending on a usage pattern. Further, the camera lens 2807 is provided on the same surface as the display panel 2802, so that the mobile phone can be used as a video phone. The speaker 2803 and the microphone 2804 can be used for videophone calls, recording and playing sound, and the like as well as voice calls. Furthermore, the housing 2800 and the housing 2801 which are developed as illustrated in FIG. 11D can overlap with each other by sliding; thus, the size of the mobile phone can be decreased, which makes the mobile phone suitable for being carried.

The external connection terminal 2808 can be connected to an AC adapter and a variety of types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 11E:
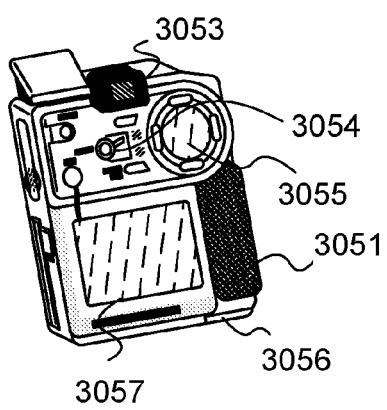

FIG. 11E illustrates a digital video camera, which includes a main body 3051, a display portion A 3057, an eyepiece 3053, an operation switch 3054, a display portion B 3055, a battery 3056, and the like. The semiconductor device described in any of Embodiments 1 to 7 is used for the display portion A 3057 and the display portion B 3055, whereby a highly reliable digital video camera can be provided.

Figure 11F:
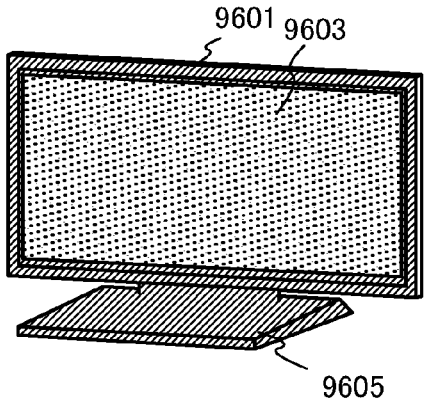

FIG. 11F illustrates an example of a television device. In the television set, a display portion 9603 is incorporated in a housing 9601. The display portion 9603 can display images. Here, the housing 9601 is supported by a stand 9605. The semiconductor device described in any of Embodiments 1 to 7 is used for the display portion 9603, whereby a highly reliable television set can be provided.

The television set can operate with an operation switch of the housing 9601 or a separate remote control device. Further, the remote controller may be provided with a display portion for displaying data output from the remote controller.

Note that the television set is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) data communication can be performed.

This embodiment can be implemented in appropriate combination with the structures described in other embodiments.

EXAMPLE

Figure 12:
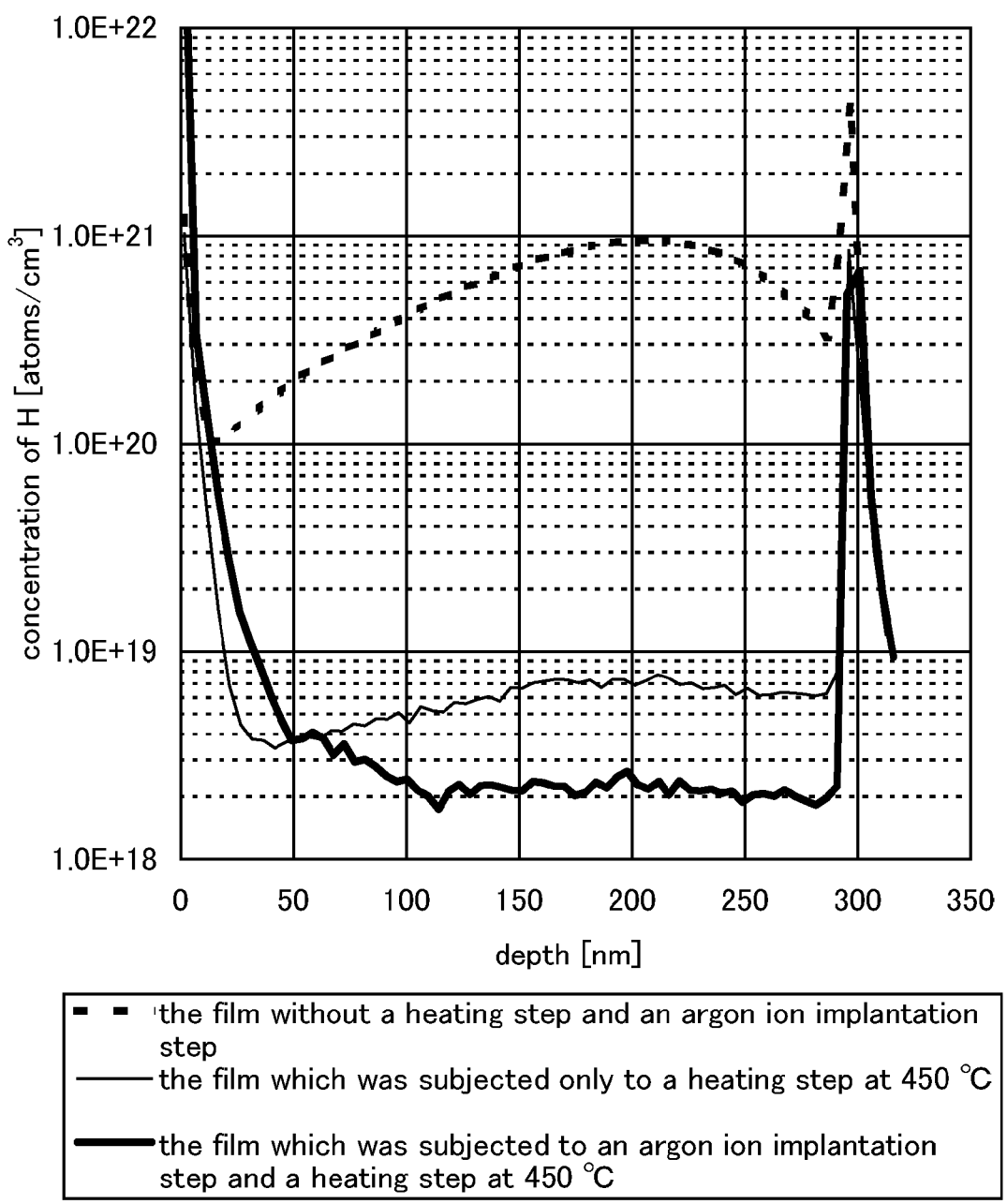
FIG. 12 is a graph showing SIMS measurement results of samples in an example.
Figure 13:
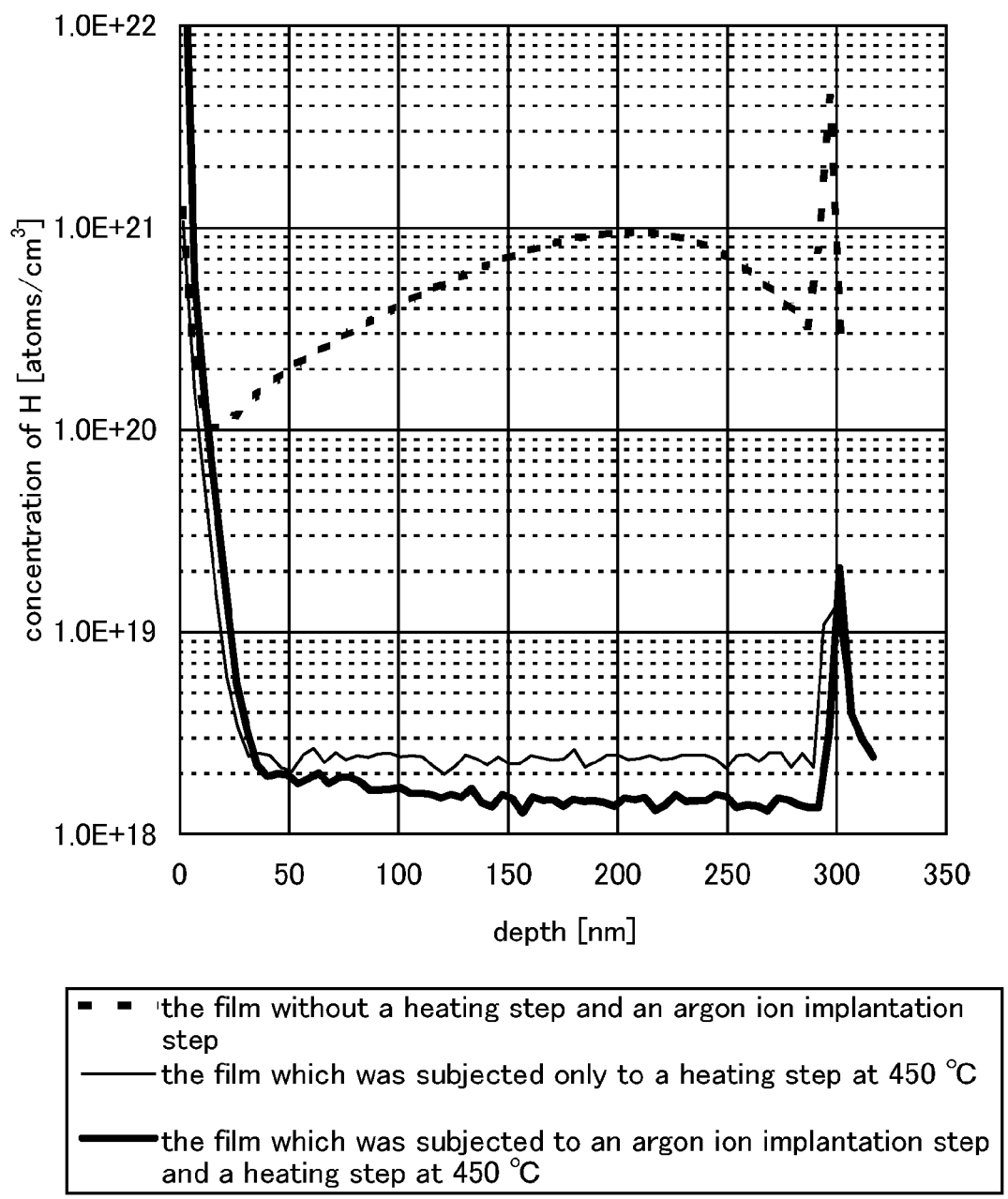
FIG. 13 is a graph showing SIMS measurement results of samples in the example.

In this example, an effect of dehydrogenation treatment on an oxide semiconductor film by a rare gas ion implantation step and a heating step in a method for manufacturing a semiconductor device according to one embodiment of the disclosed invention was evaluated through experiments. FIG. 12 and FIG. 13 show results. As the evaluation method, secondary ion mass spectrometry (SIMS) was used.

First, an In—Ga—Zn—O film with a thickness of 300 nm was formed over a silicon substrate by a sputtering method and hydrogen ions were implanted to the In—Ga—Zn—O film by an ion implantation method. The hydrogen ions were implanted at acceleration voltage of 22 kV and a dose of $1\times10^{16}$ ions/cm$^2$.

The film formation conditions of the In—Ga—Zn—O film were as follows: the target was an oxide target having a composition ratio of $In_2O_3:Ga_2O_3:ZnO=1:1:1$ [molar ratio], the distance between the silicon substrate and the target was 60 mm, the pressure was 0.4 Pa, the direct current (DC) power was 0.5 kW, the atmosphere was an atmosphere containing argon and oxygen (the flow ratio of argon to oxygen was 30 sccm: 15 sccm), and the substrate temperature was 200° C.

As samples, an In—Ga—Zn—O film to which hydrogen was implanted, a film obtained in such a manner that an In—Ga—Zn—O film to which hydrogen was implanted was subjected only to a heating step (at 450° C. or 650° C.), and a film obtained in such a manner that an In—Ga—Zn—O film to which hydrogen was implanted was subjected to an implantation of argon ions by an ion implantation method and a heating step (at 450° C. or 650° C.) were formed. Note that the argon ions were implanted at acceleration voltage of 100 kV and a dose of $1\times10^{16}$ ions/cm$^2$. Under the implantation conditions, a peak of the concentration of implanted argon in the In—Ga—Zn—O film can be greater than or equal to $1\times10^{19}$ atoms/cm$^3$ and less than or equal to $3\times10^{22}$ atoms/cm$^3$. The heating step was performed at 450° C. or 650° C. for one hour in a nitrogen atmosphere.

Each sample was analyzed by SIMS to measure the concentration of an H element in each sample. FIG. 12 shows concentration profiles of an H element in the film without a heating step and an argon ion implantation step (a dotted line), the film which was subjected only to a heating step at 450° C. (a thin solid line), and the film which was subjected to an argon ion implantation step and a heating step at 450° C. (a thick solid line), which were measured by SIMS. FIG. 13 shows concentration profiles of an H element in the film without a heating step and an argon ion implantation step (a dotted line), the film which was subjected only to a heating step at 650° C. (a thin solid line), and the film which was subjected to an argon ion implantation step and a heating step at 650° C. (a thick solid line), which were measured by SIMS.

In FIG. 12 and FIG. 13, the film which was subjected to a heating step after argon ions were implanted has lower hydrogen concentration than the film without a heating step and an argon ion implantation and the film which was subjected only to a heating step. Thus, it is found that hydrogen in the In—Ga—Zn—O film was removed through an argon ion implantation step, and a heating step and dehydrogenation treatment could be efficiently performed.

Accordingly, it is confirmed that in dehydrogenation treatment on an oxide semiconductor film, the oxide semiconductor film was subjected to a heating step after a rare gas ion implantation step was performed, whereby the oxide semiconductor film was efficiently subjected to dehydrogenation treatment and could be more highly purified.

With the use of a highly purified oxide semiconductor film, variation in the electric characteristics of a transistor can be suppressed and the transistor can be electrically stable. Further, a semiconductor device including a transistor with favorable electric characteristics and high reliability can be manufactured.

This application is based on Japanese Patent Application serial no. 2011-063976 filed with Japan Patent Office on Mar. 23, 2011, the entire contents of which are hereby incorporated by reference.

What is claimed is:

1. A method for manufacturing a semiconductor device, comprising the steps of:
    forming an oxide semiconductor film;
    forming a void into the oxide semiconductor film by an implantation step for implanting a noble gas ion inside the oxide semiconductor film;
    exposing the oxide semiconductor film after the implantation step; and
    performing a heating step under reduced pressure, in a nitrogen atmosphere, or in a noble gas atmosphere on the exposed oxide semiconductor film, so that hydrogen or water contained in the oxide semiconductor film is released through the void,
    wherein a peak of a concentration of an implanted noble gas element in the oxide semiconductor film is greater than or equal to $1\times10^{19}$ atoms/cm$^3$ and less than or equal to $3\times10^{22}$ atoms/cm$^3$ in the implantation step,
    wherein an ion implantation method, an ion doping method, or a plasma immersion ion implantation method is used for the implantation step, and
    wherein the oxide semiconductor film to which the noble gas ion is implanted is a channel formation region of a transistor.

2. The method for manufacturing a semiconductor device, according to claim 1, further comprising the step of:
    supplying oxygen to the oxide semiconductor film subjected to the heating step.

3. The method for manufacturing a semiconductor device, according to claim 1, wherein at least argon, krypton, or xenon is used as the noble gas element.

4. The method for manufacturing a semiconductor device, according to claim 1, wherein a temperature of the heating step is higher than or equal to 300° C. and lower than or equal to 700° C.

5. The method for manufacturing a semiconductor device, according to claim 1, wherein the oxide semiconductor film subjected to the heating step is amorphous.

6. The method for manufacturing a semiconductor device, according to claim 1, wherein the oxide semiconductor film subjected to the heating step includes a crystal portion.

7. A method for manufacturing a semiconductor device, comprising the steps of:
    forming an oxide semiconductor film;
    forming a void into the oxide semiconductor film by an implantation step for implanting a noble gas ion inside the oxide semiconductor film;
    exposing the oxide semiconductor film after the implantation step;
    performing a heating step under reduced pressure, in a nitrogen atmosphere, or in a noble gas atmosphere on the exposed oxide semiconductor film, so that hydrogen or water contained in the oxide semiconductor film is released through the void; and forming an insulating layer over the oxide semiconductor film subjected to the heating step, wherein a peak of a concentration of an implanted noble gas element in the oxide semiconductor film is greater than or equal to $1\times10^{19}$ atoms/cm$^3$ and less than or equal to $3\times10^{22}$ atoms/cm$^3$ in the implantation step, wherein an ion implantation method, an ion doping method, or a plasma immersion ion implantation method is used for the implantation step, and wherein the oxide semiconductor film to which the noble gas ion is implanted is a channel formation region of a transistor.

8. The method for manufacturing a semiconductor device, according to claim 7, further comprising the steps of:

forming an oxide insulating layer as the insulating layer; and heating the oxide semiconductor film subjected to the heating step with at least part of the oxide insulating layer being in contact with the oxide semiconductor film.

9. The method for manufacturing a semiconductor device, according to claim 7, further comprising the step of:

supplying oxygen to the oxide semiconductor film subjected to the heating step.

10. The method for manufacturing a semiconductor device, according to claim 7, wherein at least argon, krypton, or xenon is used as the noble gas element.

11. The method for manufacturing a semiconductor device, according to claim 7, wherein a temperature of the heating step is higher than or equal to 300° C. and lower than or equal to 700° C.

12. The method for manufacturing a semiconductor device, according to claim 7, wherein the oxide semiconductor film subjected to the heating step is amorphous.

13. The method for manufacturing a semiconductor device, according to claim 7, wherein the oxide semiconductor film subjected to the heating step includes a crystal portion.

14. A method for manufacturing a semiconductor device, comprising the steps of:

forming an oxide semiconductor film;

forming an insulating film over the oxide semiconductor film;

forming a void into the oxide semiconductor film by an implantation step for implanting a noble gas ion inside the oxide semiconductor film through the insulating film;

removing the insulating film so that the oxide semiconductor film is exposed after the implantation step; and performing a heating step under reduced pressure, in a nitrogen atmosphere, or in a noble gas atmosphere on the exposed oxide semiconductor film, so that hydrogen or water contained in the oxide semiconductor film is released through the void, wherein a peak of a concentration of an implanted noble gas element in the oxide semiconductor film is greater than or equal to $1\times10^{19}$ atoms/cm$^3$ and less than or equal to $3\times10^{22}$ atoms/cm$^3$ in the implantation step, and wherein an ion implantation method, an ion doping method, or a plasma immersion ion implantation method is used for the implantation step, and wherein the oxide semiconductor film to which the noble gas ion is implanted is a channel formation region of a transistor.

15. The method for manufacturing a semiconductor device, according to claim 14, further comprising the step of:

supplying oxygen to the oxide semiconductor film subjected to the heating step.

16. The method for manufacturing a semiconductor device, according to claim 14, wherein at least argon, krypton, or xenon is used as the noble gas element.

17. The method for manufacturing a semiconductor device, according to claim 14, wherein a temperature of the heating step is higher than or equal to 300° C. and lower than or equal to 700° C.

18. The method for manufacturing a semiconductor device, according to claim 14, wherein the oxide semiconductor film subjected to the heating step is amorphous.

19. The method for manufacturing a semiconductor device, according to claim 14, wherein the oxide semiconductor film subjected to the heating step includes a crystal portion.

20. A method for manufacturing a semiconductor device, comprising the steps of:

forming an oxide semiconductor film;

forming an insulating film over the oxide semiconductor film;

forming a void into the oxide semiconductor film by an implantation step for implanting a noble gas ion inside the oxide semiconductor film through the insulating film;

removing the insulating film so that the oxide semiconductor film is exposed after the implantation step;

performing a heating step under reduced pressure, in a nitrogen atmosphere, or in a noble gas atmosphere on the exposed oxide semiconductor film, so that hydrogen or water contained in the oxide semiconductor film is released through the void; and forming an insulating layer in contact with at least part of the oxide semiconductor film subjected to the heating step, wherein a peak of a concentration of an implanted noble gas element in the oxide semiconductor film is greater than or equal to $1\times10^{19}$ atoms/cm$^3$ and less than or equal to $3\times10^{22}$ atoms/cm$^3$ in the implantation step, wherein an ion implantation method, an ion doping method, or a plasma immersion ion implantation method is used for the implantation step, and wherein the oxide semiconductor film to which the noble gas ion is implanted is a channel formation region of a transistor.

21. The method for manufacturing a semiconductor device, according to claim 20, further comprising the steps of:

forming an oxide insulating layer as the insulating layer; and heating the oxide semiconductor film subjected to the heating step with at least part of the oxide insulating layer being in contact with the oxide semiconductor film.

22. The method for manufacturing a semiconductor device, according to claim 20, further comprising the step of:

supplying oxygen to the oxide semiconductor film subjected to the heating step.

23. The method for manufacturing a semiconductor device, according to claim 20, wherein at least argon, krypton, or xenon is used as the noble gas element.

24. The method for manufacturing a semiconductor device, according to claim 20, wherein a temperature of the heating step is higher than or equal to 300° C. and lower than or equal to 700° C.

25. The method for manufacturing a semiconductor device, according to claim 20, wherein the oxide semiconductor film subjected to the heating step is amorphous.

26. The method for manufacturing a semiconductor device, according to claim 20, wherein the oxide semiconductor film subjected to the heating step includes a crystal portion.

* * * * *